United States Patent
Shanks

(10) Patent No.: US 8,637,331 B2
(45) Date of Patent: Jan. 28, 2014

(54) TRANSPARENT POLARIZED LIGHT-EMITTING DEVICE

(75) Inventor: Mark Shanks, Baltimore, MD (US)

(73) Assignee: Bloominescence, LLC, Baltimore, MD (US)

( * ) Notice: Subject to any disclaimer, the term of this patent is extended or adjusted under 35 U.S.C. 154(b) by 0 days.

(21) Appl. No.: 13/595,771

(22) Filed: Aug. 27, 2012

(65) Prior Publication Data

US 2012/0315714 A1 Dec. 13, 2012

Related U.S. Application Data

(63) Continuation-in-part of application No. 12/580,931, filed on Oct. 16, 2009, now Pat. No. 8,253,153.

(60) Provisional application No. 61/136,965, filed on Oct. 17, 2008.

(51) Int. Cl.
*H01L 21/00* (2006.01)

(52) U.S. Cl.
USPC .............................. 438/27; 438/29

(58) Field of Classification Search
USPC .............. 438/27, 29; 257/E33.068, E21.527
See application file for complete search history.

(56) References Cited

U.S. PATENT DOCUMENTS

| | | | |
|---|---|---|---|
| 4,356,429 A | 10/1982 | Tang | |
| 4,720,432 A | 1/1988 | VanSlyke et al. | |
| 5,874,749 A | 2/1999 | Jonker | |
| 6,325,914 B1 | 12/2001 | Dediu et al. | |
| 6,366,017 B1 * | 4/2002 | Antoniadis et al. | 313/506 |
| 6,469,437 B1 | 10/2002 | Parthasarathy et al. | |
| 6,485,884 B2 | 11/2002 | Wolk et al. | |
| 6,506,616 B1 | 1/2003 | Kim et al. | |
| 6,621,100 B2 | 9/2003 | Epstein et al. | |
| 6,713,389 B2 | 3/2004 | Speakman | |
| 6,727,970 B2 | 4/2004 | Grace et al. | |
| 6,806,925 B2 | 10/2004 | Ishii et al. | |
| 6,875,320 B2 | 4/2005 | Raychaudhuri et al. | |
| 6,885,149 B2 | 4/2005 | Parthasarathy et al. | |
| 6,888,305 B2 | 5/2005 | Weaver | |
| 6,888,660 B2 | 5/2005 | Bussmann et al. | |
| 7,001,648 B2 | 2/2006 | Chen et al. | |

(Continued)

FOREIGN PATENT DOCUMENTS

JP 2006/073636 3/2006

OTHER PUBLICATIONS

Bernard, Stefan, "Research Projects; Introduction," 11 pages, May 17, 2006.

(Continued)

*Primary Examiner* — Ngan Ngo
(74) *Attorney, Agent, or Firm* — Fish & Richardson P.C.

(57) ABSTRACT

A polarized light-emitting device is fabricated by a method that includes forming a radiation-emitting layer. The radiation-emitting layer includes a radiation-emitting material that emits radiation having a wavelength included in an emission wavelength band. The radiation-emitting material is disposed between a transparent anode and a transparent cathode. An optically active reflective layer is disposed on the polarized light-emitting device. The optically active reflective layer is configured to reflect radiation having a wavelength included in a reflection wavelength band of the optically active reflective layer. The reflection wavelength band of the optically active reflective layer is adjusted to at least partially encompass the emission wavelength band of the radiation-emitting layer.

20 Claims, 17 Drawing Sheets

(56) References Cited

U.S. PATENT DOCUMENTS

| | | | |
|---|---|---|---|
| 7,417,373 | B2 | 8/2008 | Yamazaki |
| 7,432,187 | B1 | 10/2008 | Cok |
| 7,598,519 | B2 | 10/2009 | Leo et al. |
| 8,253,153 | B2 | 8/2012 | Shanks |
| 2002/0079831 | A1 | 6/2002 | He et al. |
| 2003/0001154 | A1 | 1/2003 | Epstein et al. |
| 2004/0066123 | A1* | 4/2004 | Fukuda ............ 313/114 |
| 2005/0162606 | A1 | 7/2005 | Doane et al. |
| 2005/0205884 | A1* | 9/2005 | Kim et al. ............ 257/98 |
| 2005/0253112 | A1 | 11/2005 | Kelly et al. |
| 2006/0284170 | A1 | 12/2006 | Leo et al. |
| 2007/0111027 | A1 | 5/2007 | Chen et al. |
| 2007/0153236 | A1 | 7/2007 | Quach |
| 2007/0241663 | A1 | 10/2007 | Huang et al. |
| 2009/0027630 | A1 | 1/2009 | Quach et al. |
| 2010/0072880 | A1 | 3/2010 | Adachi et al. |
| 2010/0271566 | A1* | 10/2010 | Liao .................. 349/62 |
| 2011/0012136 | A1* | 1/2011 | Yamamoto ............ 257/88 |
| 2011/0163333 | A1* | 7/2011 | Adachi ............ 257/88 |
| 2012/0032222 | A1* | 2/2012 | Saeki ............ 257/98 |
| 2012/0175590 | A1* | 7/2012 | Saeki ............ 257/13 |
| 2012/0319151 | A1* | 12/2012 | Cho et al. ............ 257/98 |

OTHER PUBLICATIONS

Bulovic, V. et al., "Transparent Light-Emitting Devices," Nature, vol. 380, p. 29, Mar. 7, 1996.

Charney, E., "Group Theory and Molecular Symmetry," The Molecular Basis of Optical Activity: Optical Rotary Dispersion and Circular Dichroism, Wiley-Interscience, Chichester, pp. 122-127, (1979).

Chen, H.P. et al., "Glassy Liquid-Crystal Films with Opposite Chirality as High Performance Optical Notch Filters and Reflectors," Adv. Mater. 2000, vol. 12, No. 17., pp. 1283-1286, Sep. 1, 2000.

Chen, S. H. et al., "Circularly polarized light generated by photoexcitation of luminophores in glassy liquid-crystal films," Macmillan Magazines Ltd., Nature, vol. 397, pp. 506-508, Feb. 11, 1999.

Chen, S. H. et al., "Communications, Glassy Liquid-Crystal Films as Broadband Polarizers and Reflectors via Spatially Modulated Photoracemization," Adv. Mater. 1999, vol. 11, No. 14, 1183-1186 (1999).

Chen, S.H., et al., "Glassy Liquid Crystals for Tunable Reflective Coloration," University of Rochester Laboratory for Laser Energetics, LLE Review Quarterly Report, vol. 93, Oct.-Dec. 2002, pp. 50-60.

Chiu, David Y.T., et al., Characterization of Transparent Organic Light-Emitting Device (TOLED), Army Reaserch Laboratory, ARL-TR-4322, Nov. 2007.

Fan, F. Y., et al., "Novel Glass-Forming Liquid Crystals. V. Nematic and Chiral-Nematic Systems with an Elevated Glass Transition Temperature," Liquid Crystals, vol. 27, No. 9, pp. 1239-1248, (2000).

Fiederling, R., et al. "Injection and detection of a spin-polarized current in a light-emitting diode," Macmillan Magazines Ltd., Nature, vol. 402, pp. 787-790, Dec. 16, 1999.

Georges H. Wagniere, "On Chirality and the Universal Asymmetry: Reflections on Image and Mirror Image", pp. 120-123, Aug. 28, 2007.

Green, M.M., et al., "Chiroptical Molecular Switches to Lyotropic Liquid Crystalline Poly(isocyanates): Induction and Photomodulation of Cholesteric Phases," Chiroptical Molecular Switches, Chapter 7, A.M. Schoevaars, ed., pp. 125-144, Sep. 1998.

Grell, M. et al., "Polarized Luminescence from Oriented Molecular Materials," Adv. Materials, vol. 11, No. 11, pp. 895-905 (1999).

Gu, G. et al., "Transparent organic light emitting devices," Applied Physics Letters, vol. 68, No. 19, pp. 2606-2608, May 6, 1996.

Hanbicky, A. T., et al., "Efficient Electrical Spin Injection from a Magnetic Metal / Tunnel Barrier Contact into a Semiconductor," Applied Physics Letters, 14 pages, Dec. 17, 2001.

Hodgkinson, I. J., et al., "Inorganic Chiral Optical Materials," Advanced Materials 2001, vol. 13, Nos. 12-13, pp. 889-897, Jul. 4, 2001.

International Search Report and Written Opinion for corresponding International Application No. PCT/US09/61079, mailed Dec. 18, 2009.

Jonker, B.T., et al., "Electrical Spin Injection and Transport in Semiconductor Spintronic Devices," Article: MRS Bulletin, www.mrs.org/publication/bulletin, pp. 740-748, Oct. 2003.

Kaestner, B., et al., "Co-Planar Spin-polarized Light Emitting Diode," 12 pages, (no date).

Kafafi, Z. H. (editor), "Organic Electroluminescence," Electroluminescence in Small Molecules, pp. 8-17, (2005).

Katsis, D., et al., "Mechanistic Insight into Circularly Polarized Photoluminescence from a Chiral-Nematic Film," Journal of Liquid Crystals, vol. 26, No. 2, pp. 181-185, (1999).

Katsis, D., et al., "Vitrified Chiral-Nematic Liquid Crystalline Films for Selective Reflection and Circular Polarization," Chem. Mater, vol. 11, No. 6, pp. 1590-1596, (1999).

Layne, Scott, "High Temperature Ferromagnetism in Chromium-Doped Indium Oxide Semiconductor Thin Films," Unpublished, Francis Bitter Magnet Lab, MIT, 14 pages, Sep. 23, 2005.

Lu, M. H., et al., "High Efficiency top-emitting organic light-emitting devices," Applied Physics Letters, vol. 81, No. 21, pp. 3921-3923, Nov. 18, 2002.

Meservey, R. et al., "Spin-polarized electron tunneling," Physics Reports, Review Section of Physics Letters, vol. 238, No. 4, pp. 173-243, (1994).

Oyler, K. D. et al., "Controlling the Helicity of 2,2'-Bipyridyl Ruthenium(II) and Zinc(II) Hemicage Complexes," J. Am. Chem. Society, vol. 129, No. 1, pp. 210-217, (2007).

Parthasarathy, G., et al., "A Highly Transparent Organic Light Emitting Device Employing a Metal-Free Cathode," Poster Session Abstract, Materials Research Fair, Princeton Materials Institute, Princeton University, Nov. 6, 1997.

Peeters, E., et al., Circularly Polarized Electroluminescence from a Polymer Light-Emitting Diode, J. Am. Chem. Soc., Communications to the Editor, vol. 119, No. 41, pp. 9909-9910 (1997).

Pu, L., "The study of chiral conjugated polymers," Acta Polymer., vol. 48, pp. 116-141, Jan. 30, 1997.

Robbie, K., and Brett, M.J., "Sculptured Thin Films and Glancing Angle Deposition: Growth Mechanics and Applications," J. Vac. Sci. Technol., A, vol. 15, No. 3, May-Jun. 1997, pp. 1460-1465.

Shi, H., et al., "Circularly Polarized Fluorescence from Chiral Nematic Liquid Crystalline Films: Theory and Experiment," Liquid Crystals, Vo. 24, No. 2, pp. 163-172, (1998).

Steeneken, P. G., et al, "Exchange Splitting and Charge Carrier Spin Polarization in EuO," Physical Review Letters, vol. 88, No. 4, 047201-1-047201-4, Jan. 28, 2002.

Tang, C.W. et al., "Organic electroluminescent diodes," American Institute of Physics, Appl. Phys. Lett., vol. 51, No. 12, pp. 913-915, Sep. 21, 1987.

Tserkovnyak, Y., "Spin and Charge Transfer in Selected Nanostructures," Physics Doctoral Thesis, Harvard University, 195 pages, Feb. 2003.

Wang, F. et al., "Optical Cross-Over Phenomenon due to a central 90 degree-twist defect in a chiral sculptured thin film or chiral liquid crystal," Proceedings of the Royal Society A, 2005, Mathematical, Physical & Engineering Sciences, vol. 461, pp. 2985-3004, (2005).

Weik, Martin, "Left-hand helical polarization," Fiber Optics Standard Dictionary, Third Edition, p. 517-518, Jan. 15, 1997.

Xu, J. et al, "Circularly polarized fluorescence from light-emitting microcavities with sculptured-thin-film chiral reflectors," Department of Engineering Science and Mechanics, Pennsylvania State University (2006).

Restriction Requirement issued in U.S. Appl. No. 12/580,931 on Jul. 29, 2011, 8 pages.

Ex Parte Quayle Office Action issued in U.S. Appl. No. 12/580,931 on Dec. 22, 2011, 4 pages.

Notice of Allowance issued in U.S. Appl. No. 12/580,931 on Apr. 23, 2012, 15 pages.

(56) References Cited

OTHER PUBLICATIONS

Chinese Office Action in Chinese Application No. 200980145940.7, dated Jun. 25, 2013, 10 pages.
Singapore Search Report in Singapore Application No. 201102569-9, mailed Apr. 4, 2013, 14 pages.

Chen, S. H., et al., "Photoracemization Broadening of Selective Reflection and Polarization Band of Glassy Chiral-Nematic Films," Liquid Crystals, vol. 27, No. 2, pp. 201-209 (2000).
Parthasarathy, G., et al., "A metal-free cathode for organic semiconductor devices," Applied Physics Letters, vol. 72, No. 17, pp. 2138-2140, Apr. 27, 1998.

* cited by examiner

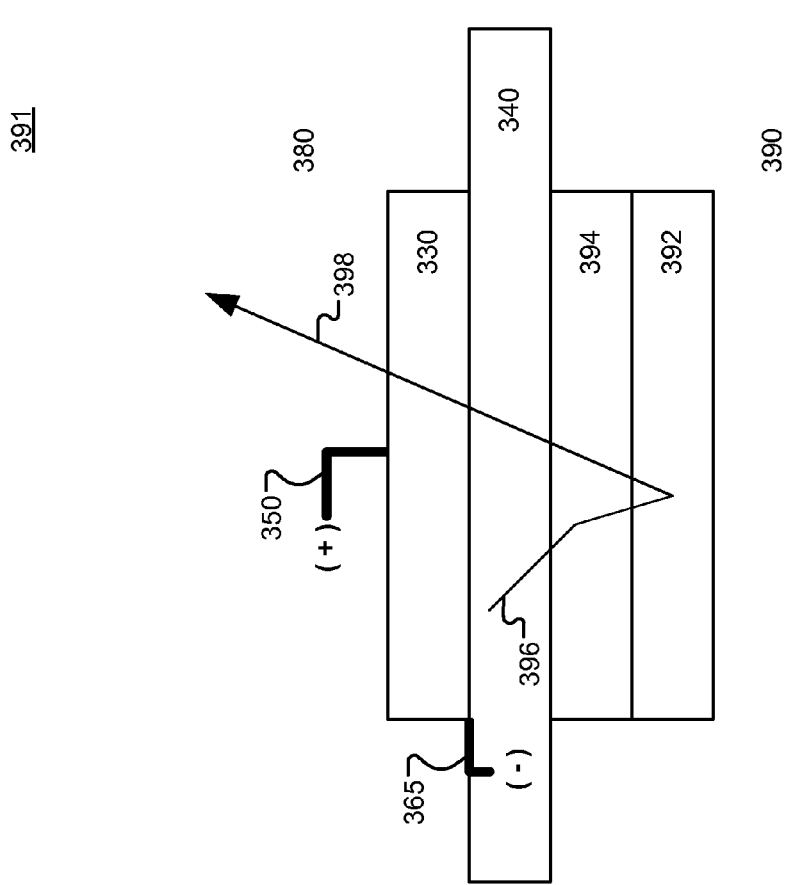

TRANSPARENT POLARIZED LIGHT-EMITTING DEVICE

CROSS-REFERENCE TO RELATED APPLICATION

This application is a continuation-in-part and claims priority to U.S. application Ser. No. 12/580,931, filed Oct. 16, 2009, now U.S. Pat. No. 8,253,153, which is a non-provisional application that claims the benefit of U.S. Provisional Application No. 61/136,965, filed Oct. 17, 2008 and titled TRANSPARENT POLARIZED LIGHT-EMITTING DEVICE, both of which are expressly incorporated herein by reference in their entirety.

TECHNICAL FIELD

This disclosure relates to a transparent polarized light-emitting device.

BACKGROUND

Organic light-emitting diodes (OLEDs) are optoelectronic devices made by placing a layer of organic material between two electrodes. When a voltage potential is applied to the electrodes and current is injected through the organic material, visible light is emitted. Due to the high power efficiency, low cost of manufacture, and durability of OLEDs, and the fact that they are lightweight, OLEDs are often used to create visual displays for portable electronic devices.

SUMMARY

In one general aspect, a transparent directional polarized light-emitting device includes a transparent anode and a transparent cathode, a radiation-emitting layer between the anode and the cathode, an optically active reflective layer with a reflection band that matches a chirality and at least partially encompasses a wavelength band of radiation emitted from the radiation-emitting layer, the optically active light blocking layer located on a side of the radiation-emitting layer, and a transparent substrate adjacent to the optically active reflective layer.

Implementations may include one or more of the following features. The radiation-emitting layer may include an organic light-emitting layer. The radiation-emitting layer may include an inorganic light-emitting layer. The inorganic light-emitting layer may include a quantum dot emitter. The device may include a hole transport layer located between the anode and the radiation-emitting layer. The device may include an electron transport layer located between the radiation-emitting layer and the cathode. The device may include an electron tunneling barrier layer located between the cathode and the electron transport layer. The device may include an electron tunneling barrier adjacent to the radiation-emitting layer. The organic light-emitting layer may include a non-racemic compound of chiral organic light emitting molecules. The organic light-emitting layer may include glass-forming chiral nematic liquid crystals (GLCs) that are embedded with organic light-emitting dopants, and the organic light emitting layer may emits chiral light.

The transparent cathode may be a spin polarized electrode. The transparent cathode may be one of a ferromagnetic electrode and a half-metallic electrode. The transparent anode may be a spin polarized electrode. The optically active reflective layer may include morphologically stable glass-forming chiral nematic liquid crystals (GLCs). The optically active reflective layer may include a cholesteric liquid crystal.

The device may include a second optically active reflective layer adjacent to the optically active reflective layer, and a reflection band of the second optically active reflective layer may have an opposite chirality to that of the optically active reflective layer and may at least partially encompasses a wavelength band of radiation emitted from the radiation-emitting layer. The second optically active reflective layer may include morphologically stable glass-forming chiral nematic liquid crystals (GLCs). The transparent anode and the transparent cathode transmit may visible light. The optically active reflective layer may include a sculptured thin film. The light-emitting layer may include a chiral material.

In another general aspect, a polarized light-emitting device is fabricated by a method that includes forming a radiation-emitting layer. The radiation-emitting layer includes a radiation-emitting material that emits radiation having a wavelength included in an emission wavelength band. The radiation-emitting material is disposed between a transparent anode and a transparent cathode. An optically active reflective layer is disposed adjacent to the radiation-emitting layer. The optically active reflective layer includes glass-forming chiral nematic liquid crystals (GLC), and the optically active reflective layer is configured to reflect radiation having a wavelength included in a reflection wavelength band of the optically active reflective layer. The reflection wavelength band of the optically active reflective layer is adjusted to at least partially encompass the emission wavelength band of the radiation-emitting layer.

In another similar general aspect, a polarized light-emitting device is fabricated by a method that includes forming a radiation-emitting layer. The radiation-emitting layer includes a radiation-emitting material that emits radiation having a wavelength included in an emission wavelength band. The radiation-emitting material is disposed between a transparent anode and a transparent cathode. An optically active reflective layer is disposed on the polarized light-emitting device. The optically active reflective layer is configured to reflect radiation having a wavelength included in a reflection wavelength band of the optically active reflective layer. The reflection wavelength band of the optically active reflective layer is adjusted to at least partially encompass the emission wavelength band of the radiation-emitting layer.

Implementations may include one or more of the following features. The radiation-emitting material may include an organic light-emitting layer. Adjusting the reflection wavelength band of the optically active reflective layer may include heating the glass-forming chiral nematic liquid crystals above a glass transition temperature (Tg) and near a critical point (Tc) of the glass-forming chiral nematic liquid crystals. The optically active reflective layer may be irradiated with electromagnetic radiation for a time duration sufficient to alter the reflection wavelength band of the optically active reflective layer to at least partially encompass an emission wavelength band of the light-emitting layer. The optically active reflective layer may cooled to a temperature below (Tg). Irradiating the optically active reflective layer may include irradiating the optically active reflective layer with ultraviolet (UV) radiation.

Adjusting the reflection wavelength band of the optically active reflective layer may include adjusting a molecular composition of the glass-forming chiral nematic liquid crystals. Adjusting the reflection wavelength band of the optically active reflective layer may result in changing a width of the reflection wavelength band. The radiation-emitting material may include an inorganic light-emitting layer. The optically active reflective layer may include a first GLC film made of a right-handed glassy cholesteric material, and a second GLC film made of a left-handed glassy cholesteric material, the second GLC film being adjacent to the first GLC film. Adjusting the reflection wavelength band of the optically active reflective layer may include adjusting a molecular ratio of the right-handed glassy cholesteric material to the left-handed glassy cholesteric material. The molecular composition of both the first GLC film and the second GLC film may be adjusted to adjust the reflection band of the optically active reflective layer.

In some implementations, a second optically active reflective layer may be deposited on the optically active reflective layer. The second optically active reflective layer and the optically active reflective layer have opposite chirality. The reflection wavelength band of the second optically active reflective layer may be adjusted to at least partially encompass the emission wavelength band of the light-emitting layer. The optically active reflective layers may be deposited consecutively, the reflection wavelength band of the second optically active reflective layer may be adjusted on a separate substrate, and the optically active reflective layer may be bonded to one side of the transparent polarized light emitting device after the reflection wavelength band of the second optically active reflective layer is adjusted.

In some implementations, the optically active layer is deposited on a transparent substrate. The transparent substrate may be located between the optically active reflective layer and the light-emitting layer.

In some implementations, the optically active reflective layer may include a holographic optical recording material layer. Adjusting the reflection wavelength band of the optically active reflective layer may include irradiating a holographic optical recording material layer with two or more collimated object beams that successively interfere with a common collimated reference beam to generate several multiplexed reflection holograms on the holographic optical recording material layer. The object beams may be circularly polarized, may have the same chirality, may have a specified wavelength to at least partially encompass the emission wavelength band of the radiation-emitting layer, and may be incident to the holographic optical recording material layer at a series of angles chosen to maximize the reflection efficiency over a desired field of view at the specified wavelength.

In some implementations, adjusting the reflection wavelength band of the optically active reflective layer may result in changing the incident angles at which the reflection wavelength band is achieved.

In some implementations, the optically active reflective layer may have a chirality, such that the optically active reflective layer is configured to reflect radiation having a chirality matching the chirality of the optically active reflective layer. The fabrication method may further include adhering a pre-fabricated broad-band circular polarization filter between the light-emitting layer and the optically active reflective layer. The circular polarization filter may have a chirality that is opposite the chirality of the optically active reflective filter.

In some implementations, the fabrication method may include adhering a prefabricated radiation-collimating layer between the radiation-emitting layer and the optically active reflective layer. The radiation-collimating layer may have an optical property of limiting the direction of radiation that is emitted by the radiation-emitting layer to an angle less than 40 degrees from normal relative to a surface of the polarized light emitting device.

In some implementations, the prefabricated light-collimating layer may be a photonic crystal composite film or a micro-louver film.

Implementations of the described techniques may include hardware, a method or process, a device, an apparatus, or a system. The details of one or more implementations are set forth in the accompanying drawings and the description below. Other features will be apparent from the description and drawings, and from the claims.

BRIEF DESCRIPTION OF THE DRAWINGS

FIG. 3B shows an example of a directionally biased light-emitting device that includes a light-collimating layer.

FIGS. 9A-11A each show a perspective view of an example directionally biased light emitting device.

FIGS. 9B-11B respectively show a cross-sectional view of the directionally biased light emitting devices shown in FIGS. 9A-11A.

DETAILED DESCRIPTION

A transparent device that emits radiation from one side, or primarily from one side, is described. In particular, an optically active reflective material is placed on a transparent electroluminescence device such that radiation emitted from a light-emitting layer in the device emanates only from one side of the device, or primarily from one side of the device, while ambient light is transmitted by both sides of the device. The device emits chiral radiation having a range of wavelengths, and a reflection band of the optically active reflective material is tuned to match both the helicity and the wavelength of the radiation emitted from the device such that the optically active reflective material reflects the emitted radiation. In this manner, the transparent electroluminescence device may be directionally biased such that emitted radiation emanates from only one side of the device, or primarily from one side of the device, rather than from both sides of the device.

The disclosed techniques relate to a particular application of organic light-emitting diode (OLED) technology. In particular, the disclosed techniques relate to transparent OLEDs (TOLEDs) that exploit the spin-polarization and the wavelength of emitted light to achieve unidirectional emission.

The devices are transparent in that the devices are made from one or more materials that are at least partially transmissive to radiation incident upon the materials. Such TOLEDs may be referred to as transparent organic unidirectional polarized light-emitting diodes (TOUPLEDs). TOUPLEDs may be incorporated into or coated on to windshields to, for example, allow a driver to see information displayed on the windshield without the information being visible from the other side of the windshield. Because the TOUPLED is transparent to ambient light, ambient light passes through the windshield. Similarly, TOUPLED technology may be utilized on helmets, specifically, military combat helmets or other visualization instruments that include a visor or eyepiece. With such an arrangement, the user of the helmet may view information displayed on one side of the visor while also being able to see through the visor because ambient light enters the visor. For example, the TOUPLED may be mounted on a visor of a military helmet such that a solider using the helmet may view tactical information displayed on the inside part of a helmet visor while the displayed tactical information would not be viewable from the side of the visor facing the environment (which is the side on which the optically active reflective layer is mounted). However, because the TOUPLED is made from materials that are at least partially transparent to ambient light, ambient light continues to pass through the visor.

Figure 1:
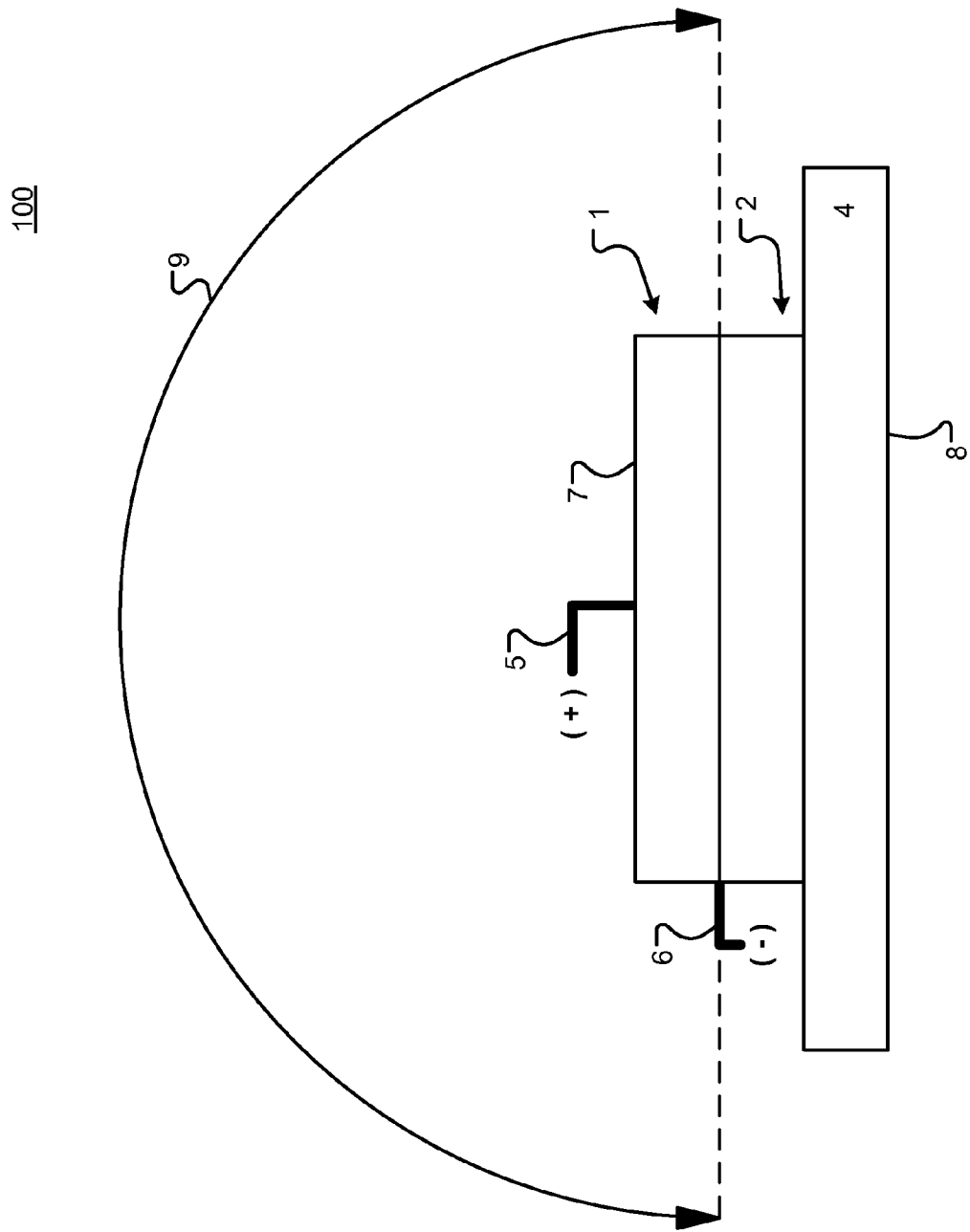
FIGS. 1 and 2 show examples of a directionally biased light-emitting device.

Referring to FIG. 1, an example of a directionally biased transparent light-emitting device 100 is shown. The light-emitting device 100 includes a light-emitting layer 1, an optically active reflective layer 2, and a transparent substrate 4. The light-emitting layer 1 is disposed between a first electrode 5 and a second electrode 6. The first electrode 5 may be a transparent anode, and the second electrode 6 may be a transparent cathode. The first electrode 5 and the second electrode 6 are transparent to the wavelengths of the radiation emitted from the light-emitting layer 1 to allow emission of radiation from the device 100. Additionally, the first electrode 5 and the second electrode 6 may be transparent to ambient light such that ambient light may pass through the device 100. Although in the example shown in FIG. 1, the first electrode 5 is located at a top 7 of the light-emitting layer 1, and the second electrode 6 is located at a bottom 8 of the light-emitting layer 1, in other examples, the first electrode 5 and the second electrode 6 may be arranged in the opposite configuration.

When a positive bias is applied across the first electrode 5 and the second electrode 6, the anode injects holes (positive charge carriers) into the light-emitting layer 1, and the cathode injects electrons (negative charge carriers) into the light-emitting layer 1. The holes and electrons recombine in the light-emitting layer 1 and generate excitons that lead to luminescence. In this manner, the light-emitting layer 1 emits radiation, preferably in the form of visible light. As discussed in more detail below, the radiation emitted from the light-emitting layer 1 has a wavelength and a chirality (e.g., the radiation is circularly polarized and has a left-handed or a right-handed orientation or the radiation is elliptically polarized and has a left-handed or a right-handed orientation).

As discussed in more detail below, the optically active reflective layer 2 blocks the radiation emitted from the light-emitting layer 1 by reflecting the emitted radiation back towards the top 7 of the light-emitting layer 1 and into a light-emission envelope 9 that is on one side of the device 100. In particular, the optically active reflective layer 2 has a reflective band that encompasses, at least partially, the wavelengths of the radiation emitted from the light-emitting layer 1. The reflective band of the optically active reflective layer 2 is the band of wavelengths that are not transmitted by the optically active reflective layer 2. Additionally, the optically active reflective layer 2 has a chirality that matches the chirality of the radiation emitted from the light-emitting layer 1.

The optically active reflective layer 2 may be considered to match the chirality and the wavelength of the radiation emitted from the light-emitting layer 1. By matching the chirality and the wavelength, the index of refraction of the optically active reflective layer 2 may be tuned, or otherwise modified, such that the wavelength of the radiation emitted from the light-emitting layer 1 is centered on the reflection band of the of the optically active reflective layer 2 and that the optically active reflective layer 2 reflects radiation having a helical polarization. Radiation having a helical polarization is radiation that is either elliptically polarized or circularly polarized and has either a right-handed or left-handed helicity, or chirality. An elliptically or circularly polarized electromagnetic wave in which the electric field vector, observed in a fixed plane normal to the direction of propagation while looking in the direction of propagation, rotates in a left-handed direction, i.e., in a counterclockwise direction, and the direction of propagation is the same as the forward direction of a left-handed screw when being screwed into a fixed nut.

In some implementations, matching the chirality and the wavelength may include tuning the index of refraction of the optically active reflective layer 2 such that the optically active reflective layer 2 has a spectral reflection band that includes at least a portion of the wavelengths of the radiation emitted from the light-emitting layer 1. In these implementations, the optically active reflective layer 2 may have a reflection band that is centered on the emission band of the emitted radiation, but that is not necessarily the case.

The optically active reflective layer 2 also may be referred to as an optically active blocking layer or an optically active filter layer. In the example shown in FIG. 1, radiation emitted from the light-emitting layer 1 exits the directionally biased transparent light-emitting device 100 through the top 7 rather than through the bottom 8 of the light-emitting layer 1. However, in other examples, the optically active reflective layer 2 may be located on the side of the top 7 of the light-emitting layer 1 such that radiation emitted from the light-emitting layer 1 exits the device 100 through the substrate 4. Thus, the device 100 may be a top-emitting transparent device or a bottom-emitting transparent device.

In one implementation, the transparent light-emitting device 100 is a transparent organic unidirectional polarized light-emitting device (TOUPLED). In this implementation, the first electrode 5 is a transparent anode, and the light-emitting layer 1 is a chiral organic molecule based light emitting layer (which may be referred to as a chiral organic light emitting layer). As discussed below with respect to FIGS. 5A and 5B, the TOUPLED also may include an electron tunneling barrier layer, a spin polarized cathode (which may be referred to as a spin-cathode), the transparent substrate 4 and, an optically active light filter layer (which may be referred to as an optically active reflective layer) tuned to the wavelength and chirality of the emitted light. In one example, the chiralty of the optically active reflective layer may be right handed such that right-handed circularly polarized light emitted from the light emitting device is reflected by the optically active reflective layer 2. In other implementations, the light-emitting layer may be made from, or may include, any light-emitting material that emits radiation having chiral components (e.g., light that is not linearly polarized).

In another implementation, the light-emitting layer 1 may be an achiral luminophore. An achiral luminophore is a light emitter that does not necessarily emit chiral radiation but may be configured, structured, or arranged to emit chiral radiation.

For example, in this implementation, the light-emitting layer 1 may be an inorganic quantum dot emitter, and the quantum dot emitter may be arranged in a chiral matrix that produces chiral radiation. In these implementations, the quantum dot emitters are deposited as a single monolayer. Depositing the quantum dot emitters as a single monolayer may help localize and, thus, control the formation and relaxation of excitons.

In other implementations, any transparent OLED layer that is transparent and does not interfere with the chirality of the emitted and blocked radiation may be used. A material that is not optically active, or is weakly optically active, does not impart a polarization on radiation passing through the material. Thus, such a material may be used as the transparent OLED layer. Materials that may be used as a transparent OLED layer include glass and ITO. In implementations that use spin-injectors, any transparent OLED layer that minimizes interference with the charge-spin life time or the chirality of the emitted and blocked radiation may be used.

Figure 2:
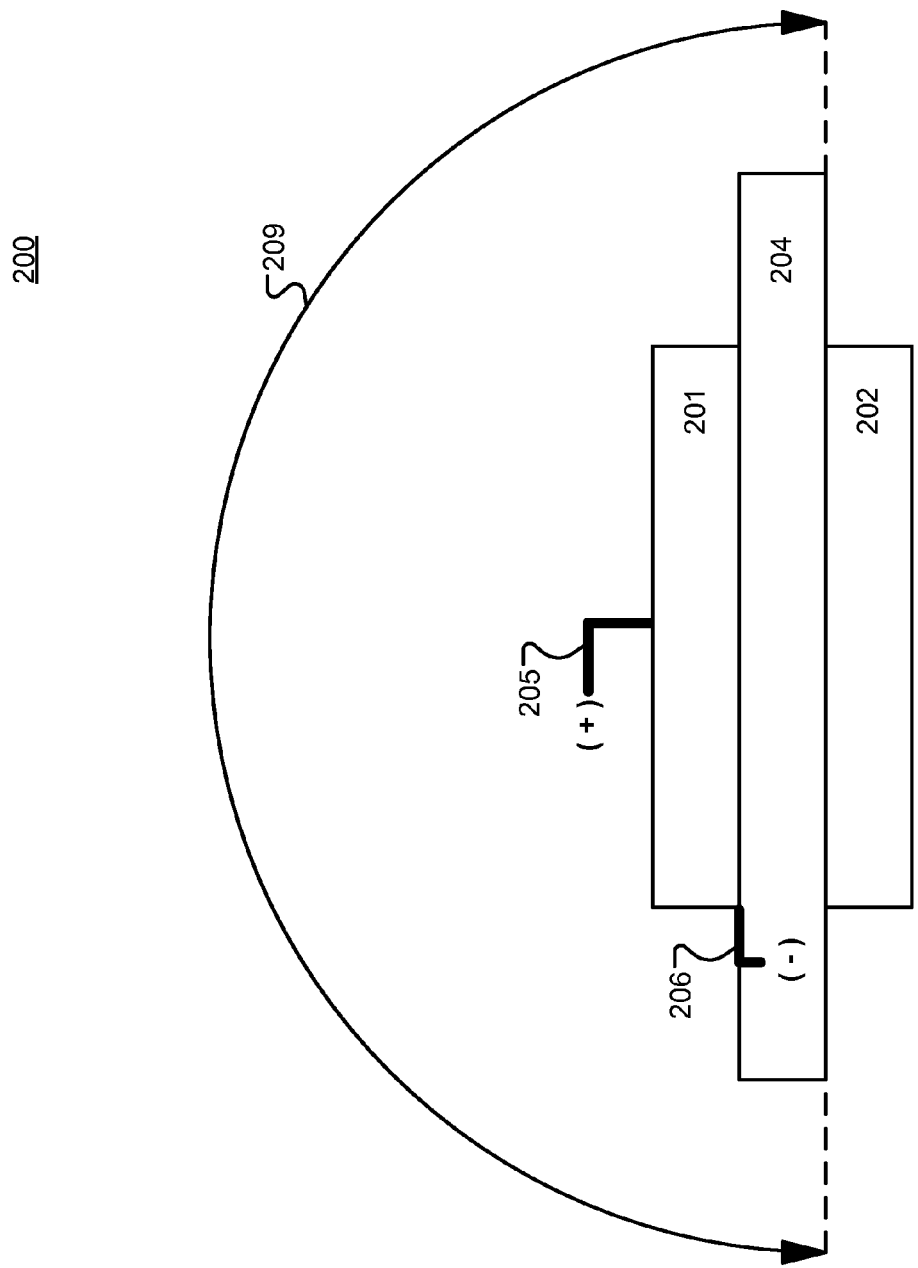

Referring to FIG. 2, an example of a directionally biased transparent light-emitting device 200 is shown. The device 200 includes a light-emitting layer 201, an optically active reflective layer 202, a transparent substrate 204, a first electrode 205, and a second electrode 206. The device 200 may be similar to the device 100 discussed above with respect to FIG. 1, except the transparent substrate 204 is disposed between the optically active reflective layer 202 and the light-emitting layer 201. Similar to the device 100, the device 200 emits polarized radiation into an emission envelope 209 on one side of the device 200.

Figure 3A:
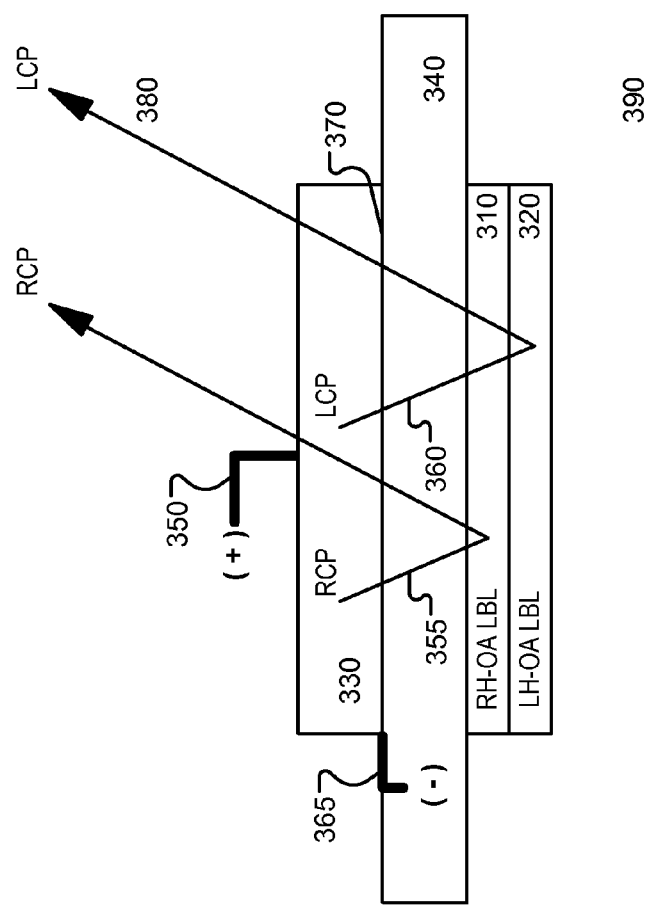
FIG. 3A shows an example of a directionally biased light-emitting device that includes two optically active reflective layers.

Referring to FIG. 3A, an example of a directionally biased light-emitting device 300 that includes two light-blocking layers, a right-handed optically active layer 310 and a left-handed optically active layer 320, is shown. The device 300 also includes a light-emitting layer 330, a transparent substrate 340, a first electrode 350, and a second electrode 365. As discussed in more detail below with respect to FIGS. 5A and 5B, radiation emitted from the light-emitting layer 330 may be chiral radiation (e.g., circularly or elliptically polarized light). Depending on the configuration of the light-emitting device 300, the chiral radiation may include approximately equal amounts of chiral light with right-handed helicity and chiral light with left-handed helicity, or the emitted chiral radiation may include primarily chiral light with right-handed helicity or primarily chiral light with left-handed helicity.

In the example shown in FIG. 3A, the light-emitting layer 330 emits radiation that includes chiral light with left-handed helicity and chiral light with right-handed helicity. Chiral light 355 with right-handed helicity is reflected from the optically active reflective layer 310, and the chiral light 360 with left-handed helicity is reflected from the optically active reflective layer 320. Thus, the radiation emitted from the bottom 370 of the light-emitting layer 330 is reflected through the top 380 of the device 300 rather than exiting device through both the bottom 390 and the top 380. Because the chirality of helically polarized light conserves orientation upon reflection off of an optically active material, but reverses orientation upon reflection off of a non-optically active material, the chiral light 360 is reflected as light with left-handed helicity, and the chiral light 355 is reflected as light with right-handed helicity.

Referring to FIG. 3B, examples of a directionally biased light-emitting device 391 that includes a light-collimating layer 394 is shown. The device 391 includes a light-emitting layer 330, transparent substrate 340, transparent cathode 350, transparent anode 365, top 380 and bottom 390 as describe above with respect to the device 300 of FIG. 3B. An optically active reflective layer 392 is provided, which may in various implementations include the features described for an optically active reflective layer in other examples. A light-collimating layer 394 is disposed between the light-emitting layer 330 and reflective layer 392, such that light 396 emitted at a relatively sharp angle may be deflected within the light-collimating layer 394 to approach the reflective layer 392 to a more moderate angle. The light thus reflected 398 may then exit the device at the more moderate angle as well. This may allow the reflective layer 392 to have a wider effective angle and accommodate a broader field of view than otherwise allowed by the properties of the reflective layer 392 alone.

Figure 4A:
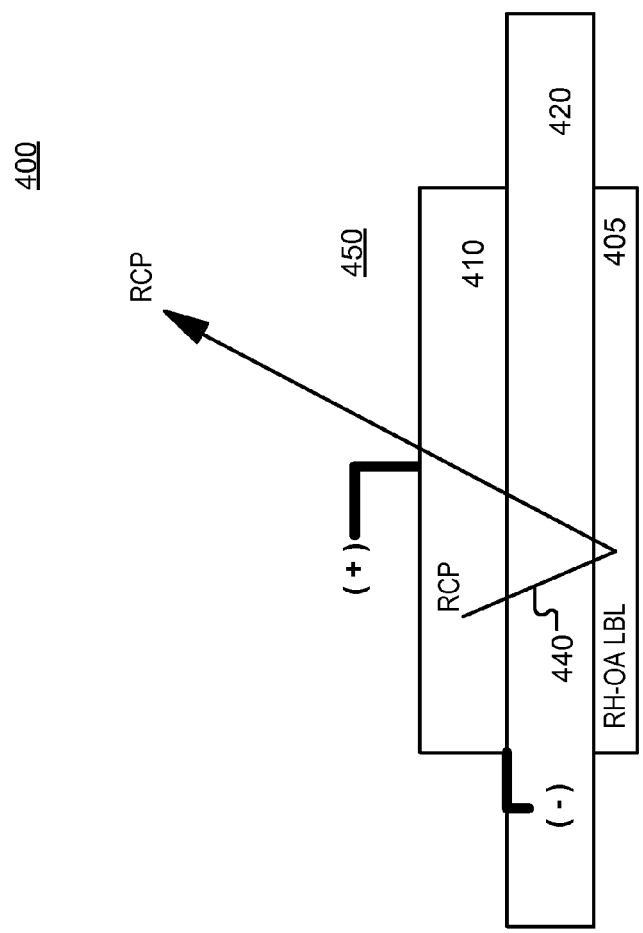
FIGS. 4A and 4B show examples of a directionally biased light-emitting device that includes one optically active reflective layer.
Figure 4B:
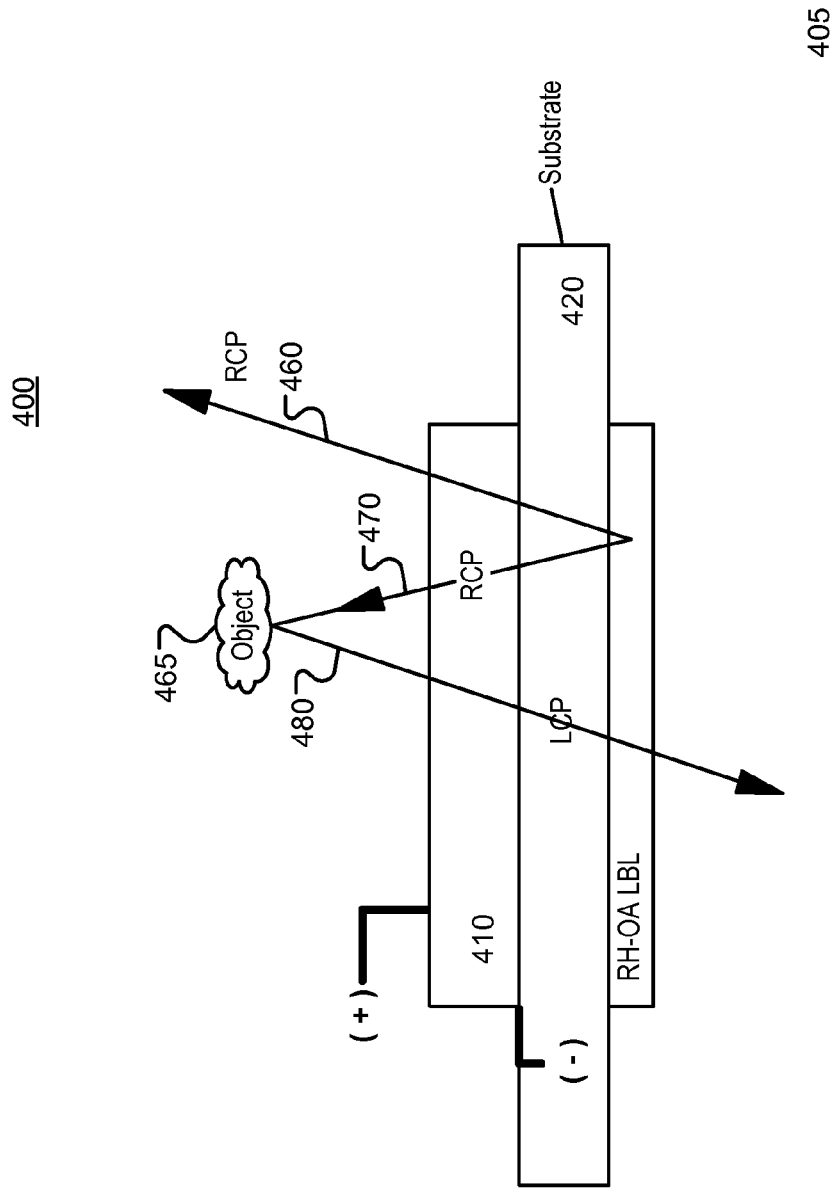

Referring to FIGS. 4A and 4B, examples of a directionally biased light-emitting device 400 that includes one optically active reflective layer 405 are shown. The device 400 includes a light-emitting layer 410 formed on a substrate 420. The light-emitting layer 410 emits radiation 440 that is circularly polarized and has a right-handed helicity. As discussed with respect to FIGS. 5A and 5B, the helicity of the radiation emitted from the light-emitting layer 410 may be controlled by, for example, introducing a population of spin up electrons into the light-emitting layer 410. As shown in the example of FIG. 4A, the radiation 440 emitted from the light-emitting layer 410, which has right-handed helicity, is reflected from the optically active reflective layer 405 and is emitted from a top 450 of the device 400. The optically active reflective layer 405 has a reflection band that has a right-handed chirality, and, thus, because the radiation 440 is chiral light with right-handed helicity, the optically active reflective layer 405 reflects the radiation 440. In some implementations, one or both of these layers 405, 410 may be pre-fabricated broadband circular polarization filters.

Referring to FIG. 4B, the behavior of the device 400 in the presence of circularly polarized light with left-handed helicity and right-handed helicity is illustrated. Circularly polarized radiation 460 with right-handed helicity emanates from the device 400 and is reflected from the optically active reflective layer 405 as circularly polarized radiation 460 with right-handed helicity. The polarized radiation 470 is reflected from the optically active reflective layer 405 because the chirality of the reflective band of the layer 405 is also right-handed. The radiation 470 is also reflected off of an object 465, changes orientation upon reflection to radiation 480, which has left-handed helicity. Because the radiation 480 has left-handed helicity, the chirality of the reflective band of the optically active layer 405 does not match the chirality of the radiation 480. Thus, the radiation 480 passes through the optically active reflective layer 405.

As discussed above, a TOUPLED may include one or more of an anode, an organic light emitting layer, a cathode, a substrate, and an optically active light blocking layer. In some implementations, the TOUPLED also includes one or more of an electron transport layer (ETL), an electron tunneling barrier layer (TBL), and a hole transporting layer (HTL). In some implementations, certain materials/substances may function as one discrete element described above and herein or may act as more than one described above and herein. For example, a particular material/substance may be used as an anode and possess certain characteristics of a hole transport layer.

Figure 5A:
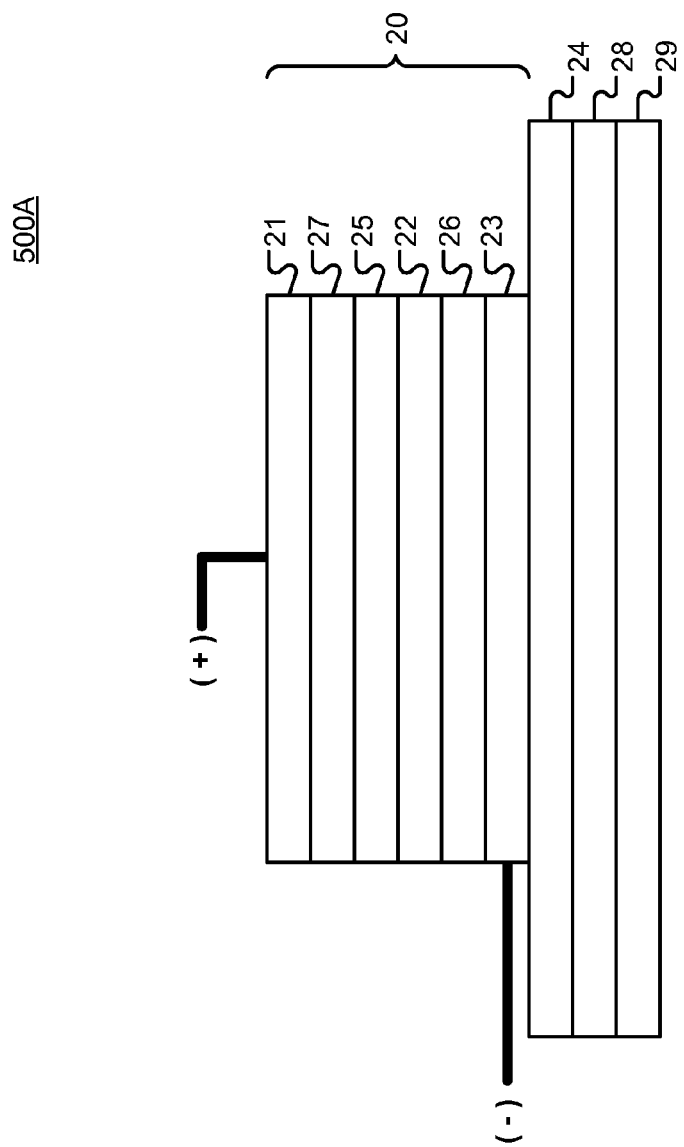
FIGS. 5A and 5B show examples of directionally biased light-emitting devices that include an organic light-emitting diode (OLED) stack.
Figure 5B:
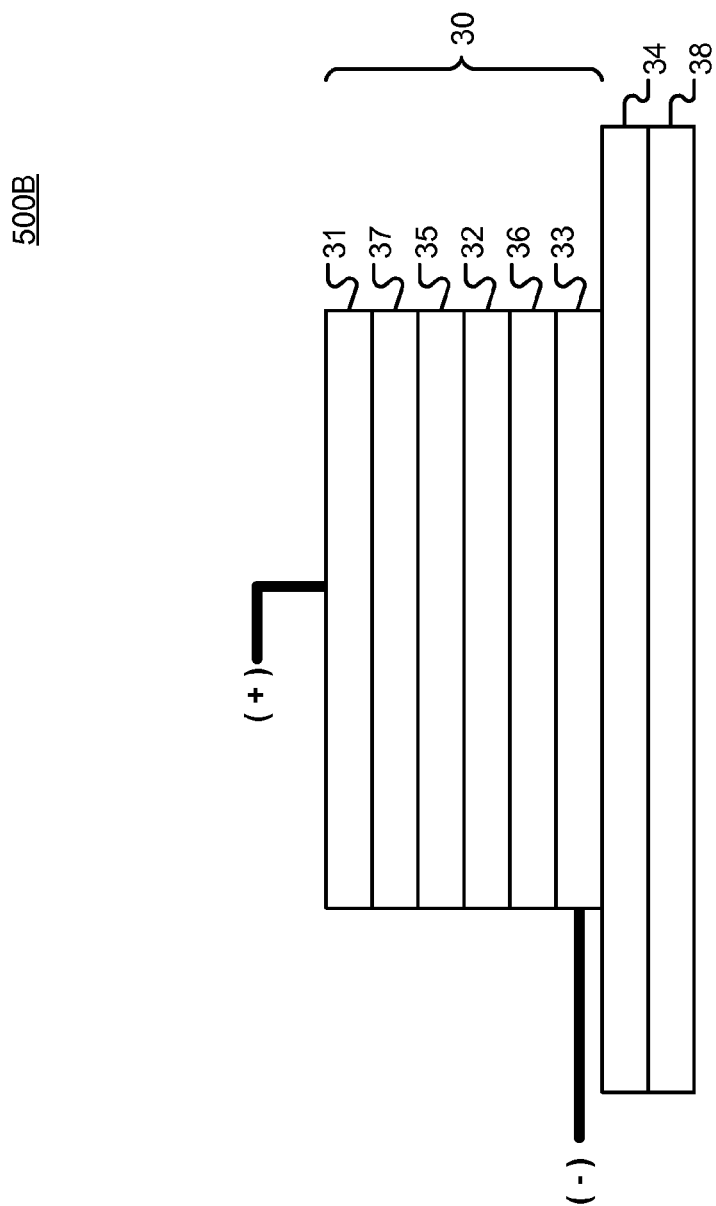

Referring to FIGS. 5A and 5B, examples of directionally biased light-emitting devices 500A and 500B that include an organic light-emitting diode (OLED) stack are shown. Referring to FIG. 5A, the device 500A includes an OLED stack 20, a substrate 24, a right-handed optically active reflective layer 28, and a left-handed optically active reflective layer 29. The OLED stack 20 includes a cathode 21, electron tunneling barrier layer 27, electron transport layer 25, light-emitting layer 22, hole transport layer 26, and anode 23. Anode 23 is adjacent to the substrate 24. Referring to FIG. 5B, the device 500B includes an OLED stack 30, a substrate 34, and an optically active reflective layer 38. The OLED stack 30 of the TOUPLED may include a cathode 31, electron tunneling barrier layer 37, electron transport layer (ETL) 35, light-emitting layer 32, hole transport layer 36, and anode 33. The anode 33 is adjacent to the substrate 34.

The directionally biased light-emitting devices 500A and 500B may be TOUPLEDs. TOUPLEDs may be considered as a series of adjacent layers consecutively deposited on a substrate. The substrate may be the substrate 4, the substrate 204, the substrate 340, the substrate 24 or the substrate 34 discussed above. Techniques for depositing layers on the substrate include, for example, chemical vapor deposition, physical vapor deposition, sputtering, thermal evaporation, e-beam deposition, vacuum deposition, spin-coating, and a modification of inkjet printer technology. The techniques for depositing layers on the substrate also may be used to introduce or "dope" additional compounds into a layer that has been deposited. For example, during fabrication of a TOUPLED, an electron transport layer (ETL), such as the electron transport layer 25 or the electron transport layer 35 discussed with respect to FIGS. 5A and 5B, may be deposited and doped with a metal either by depositing the ETL on an ultra-thin layer of lithium or by depositing the ultra-thin layer of lithium on the ETL. Based on the thicknesses of the layers prepared in this manner, the lithium may diffuse entirely, from either direction, throughout the ETL, thus forming a degenerately-doped ETL. A layer of lithium could also be deposited on both sides of the ETL, or the lithium could be co-deposited with the ETL. The lithium layer may be deposited such that the layer is about 0.5 to 1.0 nm thick.

The substrate on which the TOUPLED is fabricated is a material that is transparent to the chirality and wavelength of the radiation emitted from the TOUPLED. For example, the substrate may be glass and/or plastic. Polymer films made from, for example, polyvinylene chloride (PVC), polyethylene terephthalate (PET), polyether sulfone (PES), polyethylene naphthalate (PEN), polycarbonate (PC), nylon, polyether ether ketone (PEEK), polysulfone (PSF), polyether imide (PEI), polyarylate (PAR) and polybutylene terephthalate (PBT) may be used as plastic substrates.

The TOUPLED may include an anode, which injects positively charged carriers ("holes") into a light-emitting layer. In some implementations, as mentioned above, depending on the particular type of material/substance utilized as an anode, the anode also may transport holes into the light-emitting layer. The anode may be made from, for example, transparent indium tin oxide (ITO) or $In_2O_3:SnO_2$. The anode may be, for example, the anode 23 or the anode 33 discussed above with respect to FIGS. 5A and 5B respectively. The light-emitting layer may be the light-emitting layer 22 or the light-emitting layer 32.

The TOUPLEDs also includes a cathode, such as the cathode 21 or the cathode 31. Cathodes inject negatively charged carriers or electrons into the light-emitting layer. In some implementations, depending on the particular type of material/substance utilized as a cathode, the cathode also transports electrons into the light-emitting layer. Cathode layers may be deposited using, for example, dc sputtering/cylindrical target deposition. ITO and Indium Zinc Oxide (IZO) are two examples of a conductive material for use in manufacturing transparent cathode layers. Subsequent cathode layers may include a transparent, metallic or non-metallic materials and that serve to improve quantum efficiency of the emitting device, accommodate electron injection, minimize work function, and as a protective buffer layer facilitating the deposition of the ITO on predeposited organic layers; a transparent metal-doped cathode layer that may also function as an exciton blocking layer and/or as a hole blocking layer; or a transparent, metallic or non-metallic cathode layer followed by an electron selective layer made of a material that possesses different conductivities for up and down electron spins. Suitable materials for use in transparent cathodes to facilitate electron transport and injection may include, but are not limited to, lithium fluoride (LiF), aluminum (Al), litium-doped aluminum (Li:Al), magnesium-doped silver (Mg:Ag), bathocuproine (BCP) (2,9-dimethyl-4,7-diphenyl-1,10-phenanthroline), cesium carbonate (CsCO3), lithium-doped bathocuproine (LiBCP) or cesium-doped phenyl-dipyrenylphosphine oxide ($CsPOP_{y2}$).

In order to control the helicity of the chiral light emitted from the TOUPLED, the population of electrons having a spin up quantum spin state as compared to the population of electrons having a spin down quantum spin state may be controlled. Electrons exist in two quantum spin states, spin up and spin down, which are associated with equivalent units of angular momentum values of opposite sign. A normally distributed population of electrons is a mixture containing an equal number of electrons in the spin up state and in the spin down state. When a normally distributed population of electrons recombines with holes in a layer of organic light emitting molecules, chiral light (e.g., circularly and/or elliptically polarized light) is produced. The light emitted is approximately an equal mixture of light with right handed helicity (RH) and light with left handed helicity (LH).

In some implementations, however, the TOUPLED may utilize electrons in a single spin state. When the electrons in a single spin state recombine with holes in the TOUPLED, due to quantum spin-selection rules, the emitted chiral light has a single handedness (helicity) relative to the emitter molecule orientation. The helicity of the emitted light is measured with respect to the emitter molecule's axis of magnetic alignment and the sign is a function of the spin state of the injected electrons and holes. For example, when electrons in the spin-up state recombine with holes, chiral light with right-handed helicity is emitted in a forward direction with respect to an aligning magnetic field. When electrons in the spin down state recombine with holes, chiral light with left-handed helicity is emitted in a forward direction with respect to an aligning magnetic field.

Spin polarized electrons may be produced by, for example, spin filtration via tunneling and spin polarization via a magnetized injector. Spin filtration via tunneling utilizes an electron tunneling barrier layer (TBL) located either adjacent to the cathode or sandwiched between two electron transport layers, one of which is adjacent to the cathode. Electrons in the spin up state have greater momentum than electrons in the spin down state. The greater momentum of electrons in the spin up state allows these electrons to tunnel through the TBL, while electrons in the spin down state are unable to pass through the TBL. Therefore, the TBL enriches the current flowing in the light-emitting layer with electrons in the spin up state. The population of spin up electrons radiatively recombines with holes in the light-emitting layer, and, thus, the light-emitting layer emits chiral light with right handed helicity. Spin tunneling filtration may yield an electron population with nearly 100% spin up electrons. Thus, the emitted radiation is nearly 100% right-handed polarized radiation. The TBL may be made from, for example, $Eu_xO_y$ (x>>y), which is selected for its ability to participate in large exchange splitting in the conduction band (on the order of 0.6 eV), and because of its high degree of transparency. Other materials having a high degree of transparency and the ability of participate in exchange splitting, such as magnesium monoxide and ITO, may be used. Electrons carry different magnetic momentum depending on the spin state of the electron. Certain materials participate in exchange splitting, and in these materials, electrons in the spin-up state (which have a higher momentum that electrons in the spin-down state) have a higher probability of tunneling through the material. The larger the exchange splitting, the more effectively the material discriminates between spin-up and spin-down electrons. Thus, in materials having relatively large exchange splitting, spin-up electrons have a higher probability of tunneling through the material and, as a result, more spin-up electrons pass through. As a result, a spin-polarized current is generated.

In some implementations, electrons in the spin up state may be produced via a magnetized injector. A magnetic electron injection cathode, such as chromium doped indium tin oxide, forms spin-up polarized electrons that are injected into the light-emitting layer. The radiative recombination of electrons in the spin-up state with holes results in the emission of chiral light with right-handed helicity. The electron-spin selective cathode may be made from, for example, chromium doped indium tin oxide (Cr:ITO); chromium doped indium oxide (Cr:IO); any transparent half metal (Mo, Zr, Nb, Ru, Tc doped with $K_2S$ (about 5% doped)); Zr, Tc, and Ru doped with $K_2O$ (about 5% doped); or Zr, Nb, and Ru doped with $K_2Se$, $K_2Te$, or $Rb_2S$; any transparent Heusler alloy; any compound from a class of materials known to be half-metallic and having the formula $X_2YZ$, where X and Y are transition elements (groups IB to VIIIB on the periodic table) and Z is a group III, IV, or V element.

Figure 6A:
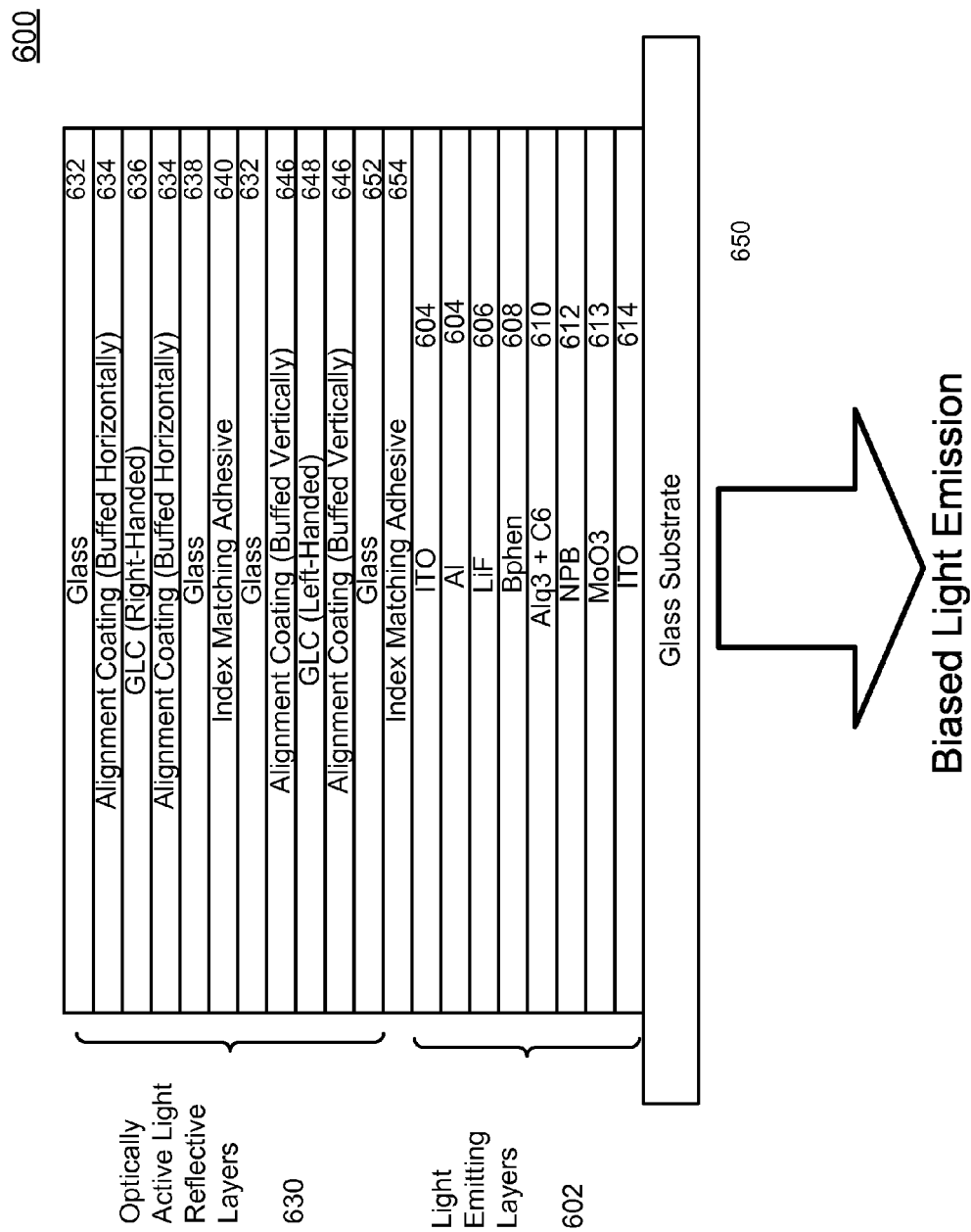
FIG. 6A shows an example of a directionally biased light-emitting device that includes an organic light-emitting diode (OLED) stack.

In some implementations, a magnetized injector may be used in combination with an electron tunneling barrier layer to achieve a purer spin-polarized current at a higher ambient temperature than either the spin filtration or the magnetized injector may achieve singly. The magnetized injector may be used to supply a pre-spin polarized current (e.g., spin-up) to the tunnel barrier that in turn filters out any remaining electrons in the spin down state. Polarized electrons in the spin up state also may be produced by hybrid spin injecting tunneling filters. Like their electron counterparts, holes may be considered as existing in two separate quantum spin states. Thus, chiral light of a single helicity may be produced by the radiative recombination of electrons with spin polarized holes. Chiral light of a single helicity also may be produced by the radiative recombination of spin polarized electrons with spin polarized holes. FIG. 6A shows an example of a directionally biased light-emitting device that includes an organic light-emitting diode (OLED) stack. The example device 600 shown in FIG. 6A is a TOUPLED that includes an organic light-emitting layer (OLEL) 602 that is transparent. The OLEL 602 includes a cathode 604, an electron injection layer 606, an electron transport layer 608, an organic light-emitting layer 610, a hole transport layer 612, and an anode 614. An optically active reflective layer may be disposed on either the cathode or the anode of the stack. In the example shown in FIG. 6A, an optically active reflective layer 630 is disposed on the cathode 604.

In the example shown in FIG. 6A, the anode 614 includes a conductive anode of ITO and glass. The ITO layer is approximately forty-two nanometers (42-nm) thick. The light-emitting layers 602 also include a inter-layer electrical short reduction layer 613 made from a layer of molybdenum oxide ($MoO_3$) that is about 20-nm thick, and the hole transport layer 612, which in this example includes a layer of N,N' di(naphthalene-1-yl)-N,N'-diphenyl-benzidine (NPB) that is about 55-nm thick. The light-emitting layer 610 is made of Alq3+C6 and is about 60-nm thick, and the electron transport layer 608 is about 40-nm thick and is made of 4,7-Diphenyl-1,10-phenanthroline (Bphen). The electron injection layer 606 is about 0.5-nm thick and made of lithium fluoride (LiF). In the example of FIG. 6A, the cathode 604 includes ITO and aluminum (Al). The ITO layer is about 65-nm thick, and the aluminum layer is about 100 nm thick. The presence of the aluminum layer allows the ITO to be sputtered, or otherwise, applied to the electron injection layer 606.

In another implementation, the cathode may include a conductive cathode of ITO and glass, an electron injection layer of cesium carbonate ($CsCO_3$), an electron transport layer of Bphen, a light-emitting layer of Alq3+C6, a hole transport layer of $MoO_3$ and NPB, and an anode of silver (Ag) and ITO. The silver portion of the anode may be a thin layer of silver through which light passes, and the silver acts as a protective layer that allows the ITO to be sputtered onto the hole transport layer.

The device 600 also includes the optically active reflective layers 630. The optically active reflective layers 630 include a layer of glass 632, and an alignment coating 634 that is about 30-40-nm thick and buffed horizontally. A layer of the alignment coating 634 is placed on both sides of a right-handed GLC 636, which is about 8-μm thick, and a layer of glass 638 is disposed on the opposite side of the GLC 636. An index matching adhesive 640 is disposed on the layer of glass 638, and an alignment coating 646 that is buffed vertically and is about 30 to 40-nm thick is disposed on both sides of a left-handed GLC 648 that is about 8-μm thick. A layer of glass 652 and an index matching adhesive layer 654 are also included in the optically active reflective layers 630. In the example shown in FIG. 6A, the right-handed GLC and the left-handed GLC are both tuned to have a reflection band about 75-nm wide and centered at 525-nm.

In either of these implementations, the optically active layers 630 may be adjacent to the cathode 604 or to the anode 614. In the example of FIG. 6A, the optically active layers 630 are adjacent to the cathode 604 and the directionally biased light from the device 600 is emitted from the bottom 650 of the device.

The layer thicknesses may be other than specified in the example of FIG. 6A. In some implementations, the hole transport layer 612 may be a thickness between 5-nm and 100-nm, the organic light-emitting layer 610 may have a thickness between 10-nm and several hundred nm, the electron transport layer 608 may have a thickness between 10-nm and several hundred nm, and the thin-metal electron injection layer 606 (which is aluminum in the example of FIG. 6A), may have a thickness between 10-nm and several hundred nm.

Figure 6B:
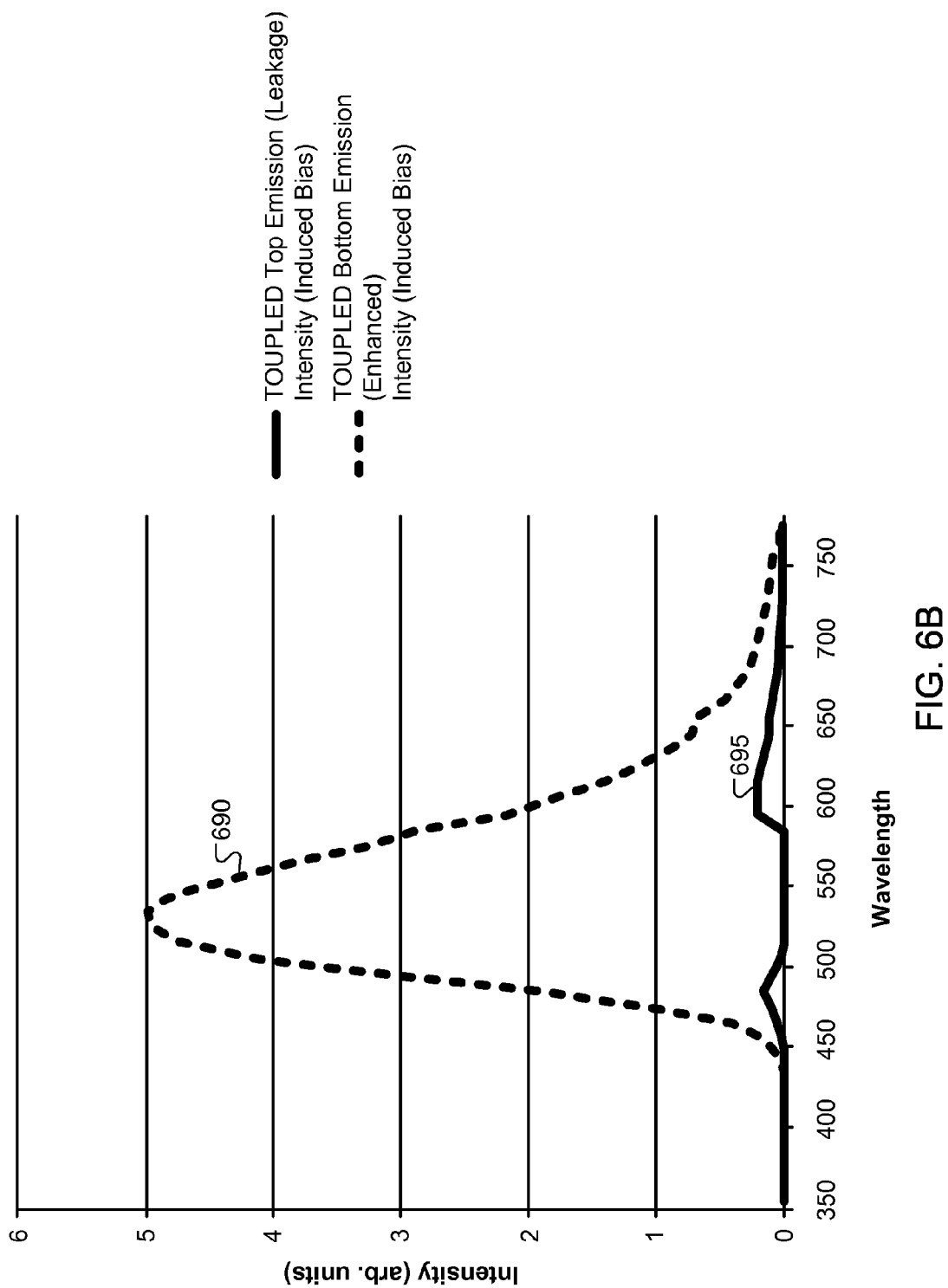
FIG. 6B shows an illustration of emission characteristics from the device shown in FIG. 6A.

FIG. 6B illustrates emission characteristics of the device 600 that is shown in FIG. 6A. The emission characteristics include a curve 690 and a curve 695, each of which represent intensity as a function of the wavelength (in nm) of radiation emitted from the device 600. The curve 690 shows emissions from the bottom of the device 600, and the curve 695 shows emissions from the top of the device 600. As seen in FIG. 6B, the device 600 is directionally biased such that the intensity of emissions from the bottom of the device 600 is greater than the emission from the top of the device 600. The emissions from the top of the device 600 are mainly attributable to leakage from the device 600. However, the emissions from the bottom of the device 600 are caused by reflections of the light from the light emitting layers 602 off of the optically active layers 630. Thus, the emissions from the bottom of the device 600 are significantly greater in intensity than the emissions from the top of the device 600, and the emissions from the bottom of the device 600 are centered on a wavelength of about 525 nm due to the tuning of the reflection bands of the GLC layers 636 and 648 that are included in the optically active reflective layers 630.

In addition to the tuning of the reflection bands as a function of wavelength, some applications may benefit from the optically active reflective layer selectively reflecting light emitted within a particular field of view. Therefore, in some implementations, the optically active reflective layer may also be tuned according to angle of incidence of radiation. Different reflective layers, as described further below, may have a tuned angle of reflection using different methods known in the art; for example, the angles of the beams used during fabrication in irradiating reflective layers may affect the resulting field of view.

In some implementations, the TOUPLED also may include additional layers disposed between the anode and the cathode, each layer having different compositions and performing different functions. Such materials should be selected for their charge mobility characteristics to generate smooth energy-level transitions (ionization potentials) between successive layer interfaces where unrestricted charge transport is desired or to generate energy barriers where localization of charge carrier recombination is desired. Materials may be small molecules or polymers. For example, the TOUPLED may include an electron transport layer (ETL), such as the electron transport layer 35. The ETL may efficiently disperse the injected current of negative charge carriers (electrons) across the surface of the layer, and the ETL provides a homogenous current at the boundary of the ETL and the layer on the side of the ETL opposite from the cathode. The ETL may also serve as a positive charge carrier (hole) blocking layer to promote the likelihood and localization of charge carrier recombination in the light emitting layer. A spin-polarized electron transport layer may improve the probability that the spin polarized state of the injected electrons is conserved. Suitable ETL materials include, but are not limited to 4,7-Diphenyl-1,10-phenanthroline (Bphen), 2,9-Dimethyl-4,7-diphenyl-1,10-phenanthroline (BCP), or Tris-(8-hydroxyquinolinato)aluminum ($Alq_3$).

In other implementations, a hole transport layer (HTL), such as the hole transport layer 36, may be provided to efficiently disperse the positive charge carriers (holes) across the HTL so that a homogenous current (hole) is provided to the surface of the layer adjacent to the HTL, which may be the light-emitting layer. The HTL may also serve as a negative charge carrier (electron) blocking layer to promote the likelihood and localization of charge carrier recombination in the light emitting layer. One or more HTL layers may be used in succession. The HTL may be made from a host of materials including but not limited to N,N' di(naphthalene-1-yl)-N,N'-diphenyl-benzidine (NPB), or 4,4'-bis[N(1-napthyl)-N-phenylamino]biphenyl (alpha-NPD) (NPD), 1,3,5-Tris(diphenylamino)benzene 97% (TDAB), or from the TDATA family such as 4,4',4"-tris[2-naphthyl(phenyl)amino]triphenylamine (2-TNATA) as small molecule examples, or Poly(2-vinylnaphthalene) as a polymer example. Dopant materials may be added to the HTL to improve device lifetime and efficiency. For instance, NPB may be doped with molybdenum oxide (MoO3) to reduce the hole injection barrier, improve interfacial stability, and suppress crystallization of the HTL.

In some implementations, the materials/substances that function as the ETL or as the HTL may include the same materials that are incorporated into the light-emitting layer to produce the electroluminescent emission. If the HTL or ETL function as the emissive layer (e.g., the light-emitting layer) of such a device, then the TOUPLED may be referred to as having a single heterostructure. Alternatively, a TOUPLED, having a separate layer of electroluminescent material included between the HTL and ETL, may be referred to as having a double heterostructure. Thus, a heterostructure for producing electroluminescence may be fabricated as a single heterostructure or as a double heterostructure.

In some implementations, one or more buffer layers may be inserted between successive layers to reduce the abrupt differential barrier height between successive layer work-functions.

In some implementations, a light-collimating layer may be disposed between the light-emitting layer and the optically active reflective layer in order to collimate the emitted light and reduce its angle of emission. For example, a light-collimating layer may limit the direction of radiation emission to an angle less than 40 degrees from normal relative to the surface of the device. The light-collimating layer may help to direct the light to within the light-emitting envelope, and may be used in conjunction with angle tuning of the radiation emitting layer. In some implementations, the light-collimating function may be performed by one or more substrates, and may be a feature of the substrates 204, 340, or 420 as described above.

The material properties of the light-emitting layer determine the wavelength and, hence, the color of the radiation emitted from the OLED. Through selecting differing organic solids for the light-emitting layer with a material such as coumarin 6 (C6), or through doping the organic solid used to make the light-emitting layer, the color of the radiation emitted may be varied. In some implementations, individual TOUPLED stacks include light-emitting layers that emit light of a particular color, and in other implementations, a TOUPLED includes multiple light-emitting layers that each emit light of different colors. TOUPLED light emitting materials with narrow band emission (saturated color) should be selected Suitable material for the light emitting layer include, but are not limited to Tris-(8-hydroxyquinolinato)aluminum ($Alq_3$), Bis-(8-hydroxyquinolinato)zinc (Znq), Tris(1,10-phenanthroline)ruthenium(II) chloride hydrate, as small molecule examples, or Poly(9,9-di-(2-ethylhexyl)-9H-fluorene-2,7-vinylene) as a polymer example.

Furthermore, in some implementations, the wavelength of the radiation emitted by the organic light emitting layer (OLEL) may be modified by addition of fluorescent and/or phosphorescent materials that absorb the light emitted by the light-emitting layer and re-emit radiation of longer wavelength. In some implementations, the color of the emitted radiation may be altered by placing a colored or photoluminescent film between the TOUPLED and the observer.

The TOUPLED also includes an optically active reflective layer, such as the optically active reflective layer 2, the optically active reflective layer 202, the optically active reflective layers 405 and 420, the optically active reflective layer 28 and 29, or the optically active reflective layer 38. The optically active reflective area may be an optically-active chiral-light blocking layer (OA-LBL). Materials suitable for use as OA-LBLs include, for example, dichroic materials, organic compounds containing asymmetric carbon atoms, and from inorganic compounds such as glass-forming chiral nematic liquid crystals (GLC), chiral dielectric sculptured thin film, and holographic optical recording material wavelength selective reflectors. Furthermore, the layers that function as OA-LBL may be deposited using methods similar to those used to deposit the other layers of a TOUPLED. Sculptured thin films are fabricated using a technique that involves controlling the motion of the substrate on which the film is fabricated during the fabrication process. Typically, fabrication of the sculptured thin film involves computerized control of the rotation of the substrate about two axes during the deposition process. The holographic optical recording material is a material suitable for holographic recording and therefore reflecting the wavelength, polarization, and incident angle of light with properties matching the properties of light emitted from the light-emitting layer. Suitable materials facilitate the recording of multiplexed holographic images of light incident at multiple angles, which enable the OA-LBL to reflect emitted light over a wide field of view. In implementations comprising two OA-LBLs, a standard pre-fabricated broad-band circular polarization film consisting of quarter-wave retardation and linear polarization sublayers may serve as a suitable OA-LBL, so long as the circular polarization film is deposited between the light emitting layer and the second OA-LBL. Such a configuration may be used in applications where it is desired to reduce the color tint that inherently results from narrow-band OA-LBL reflection of ambient light.

In one implementation, the OA-LBL may include a GLC layer which is a cholesteric thin film including a helical stack of quasinematic liquid crystal layers. The optical properties of the GLC film are determined to a large degree by the chirality (i.e. right- or left-handedness) and helical pitch length. The chirality of the GLC film is determined by the rotational direction of the cumulative nematic director twisting which results from the rotation of each successive quasinematic liquid crystal layer about the intended optical axis of the film. The helical pitch length determines the distance required to complete a 360-degree rotation of the optical director. A cholesteric liquid crystal film may be made of a helical stack of quasinematic layers, and the handedness (right-handedness or left-handedness) describes the direction in which twisting of the nematic director occurs from one layer to the next. The helical pitch length is the distance along the direction of propagation of radiation through the layers over which the director rotates 360°.

altered by modifying the GLC chemical composition. Additionally or alternatively, the reflection band may be tuned by, for example, photomodulation of the GLC film or by altering or adjusting the molecular ratio of the GLC film. In some implementations, the reflection band may be adjusted using both photomodulation and adjustment of the molecular ratio by, for example, adjusting the molecular ratio of the materials in the GLC film and then photomodulating the GLC film.

In some implementations, the reflection band of the GLC layer may be considered to act as an optical notch filter that has a reflection band set (or tuned) by adjusting a molecular ratio between the materials from which the GLC film is made. For example, the GLC optical notch filter may have two adjacent single-handed GLC films, with each film having a chirality that is opposite from the chirality of the other film. In this implementation, each GLC film includes an appropriate ratio of right-handed (R) and left-handed (S) glassy cholesteric material such as, for example, 2N1CH-R and 2N1CH-S, respectively. A ratio of the left-handed glassy cholesteric material to the right-handed glassy cholesteric material may be adjusted to tune the reflection band of the GLC film. This ratio may be referred to as the GLC ratio and may be considered to be a molecular ratio of the right-handed (R) glassy cholesteric material to the left-handed (S) glassy cholesteric material. For example, a GLC ratio of S-to-R molecules of 81:19 results in an enantiomeric excess of "S" molecules that yields a single left-handed film in a particular wavelength range. The opposite GLC ratio (S-to-R of 19:81) results in an enantiomeric excess of "R" molecules that yields a single right-handed film at the same, or almost the same, wavelength range. Adjusting the GLC ratio shifts the reflection band of the GLC film, and may thus be considered to tune the GLC film. Additionally, the molecular composition of the glassy cholesteric material may be modified to adjust the width of the optical notch (e.g., the spectral width of the reflection band). An example structure of a GLC molecule from U.S. Pat. No. 7,001,648, which is herein incorporated by reference in its entirety, as shown below.

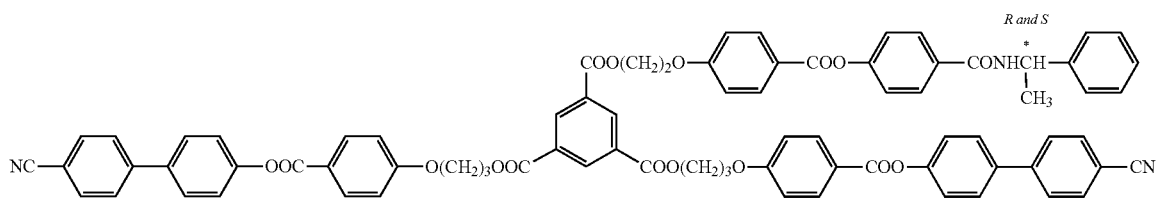

Cholesteric liquid crystals may be derived from nematic liquid crystals that have been doped with very low concentrations of chiral dopants, and the cholesteric pitch of the cholesteric phases is sensitive to structural modifications of the chiral dopant. Thus, the initial helical pitch is largely determined by the selection of a particular chiral dopant, and the reflection band of the GLC layer may be set by selecting a particular dopant molecule without necessarily performing subsequent photomodulation on the GLC layer. The ability of the GLC film to selectively reflect a given wavelength is governed a relationship between the helical pitch length and the extraordinary and ordinary refractive indices of the quasinematic layers. The differential between these extraordinary and ordinary refractive indices determines the overall optical birefringence of the GLC film, which, in turn, determines the width of the selective reflection wavelength band. The wavelengths associated with this selective reflection band may be In implementations having multiple GLC films, the GLC films may be adjacent to each other by overlapping, or partially overlapping, each other such that radiation that is incident on one of the GLC films and propagates through the GLC film is also incident on the other GLC film. The adjacent GLC films may overlap by making contact with each other, or the GLC films may be positioned close to each other, without necessarily touching each other, such that radiation passes from one film to the other. The GLC films may be aligned such that the optical director of one GLC film is perpendicular to the optical director of the other GLC film.

In some implementations, the GLC reflection band wavelength may be increased or decreased by completing a photomodulation process on a deposited GLC film. In some implementations, the photomodulation process includes heating the GLC thin film to a point above the glass transition temperature of the film (Tg) followed by a period of irradiation with ultraviolet (UV) radiation. The glass transition temperature of the film depends on the chemical composition of the film. The GLC thin film also may be heated to a temperature near a critical temperature (Tc) of the film. For example, a GLC with Tg of 68° C. and Tc of 134° C. may be heated to 120° C. (thus the GLC thin film is heated to a temperature that is 14° C. from the Tc). The heating is followed by a period of UV irradiation with, for example, UV radiation having a wavelength of 334 nm and an intensity of 70 mW/cm². The angle of the irradiation may, in some implementations, impact the resulting angle at which the GLC thin film can reflect the selective reflection band; it may therefore be possible to tune the field of view of the resulting optically active reflective layer by selecting the angle of irradiation in addition to other factors used to select a particular reflection band.

The longer the exposure time to the UV radiation, the longer the resulting nematic liquid crystal helical pitch length, and hence the longer the selective reflection band wavelength of the GLC thin film. The irradiation time is dependant on the initial (unmodulated) reflection band, but the irradiation time is a time duration that is sufficient to alter the reflection wavelength band of the GLC thin film. The closer the initial reflection band is to the final desired reflection band, the shorter the required irradiation. Typically, within the visible spectrum, irradiation times may last from tens of seconds, to tens of minutes. For example, the irradiation time to shift the reflection band from 400 nm to 550 nm may be about 10 minutes, whereas the band shift from 400 nm to 750 nm may be about 40 minutes. The radiation used to irradiate the GLC film may be unpolarized UV light. UV light is used if only a GLC optical notch filters (stacked left- and right-handed GLC filters) are being simultaneously photomodulated (e.g., tuned).

The film is then cooled to a point below (Tg; typically room temperature) at which point the attained selective reflection wavelength becomes frozen in the solid state of the GLC thin film.

In some GLC materials the photomodulation process is reversible, where heating of the GLC thin film with a predetermined selective reflection band above (Tg) followed by irradiation of the film with a shorter wavelength than the selective reflection band for a sufficient period of time decreases the helical pitch length of the nematic liquid crystal, thereby decreasing the wavelength of the GLC selective reflection band. Subsequent cooling to a point below Tg will freeze the reflection wavelength in the solid state of the GLC thin film. In the TOUPLED application, in one implementation, a GLC OA-LBL layer of a given chirality (left- or right-handed) is selected to match the chirality of the helically-polarized light emitting layer and is deposited on the exposed side of the TOUPLED substrate. The GLC layer is subsequently photomodulated (e.g., tuned) to encompass the wavelength band emitted by the organic light-emitting layer. The photomodulation process may be accomplished by using either an external radiation source or light emitted by the TOUPLED light emitting layer itself.

In another implementation, the TOUPLED light emitting layer includes a light emitting layer that achieves a less than ideal degree of helical polarized emission. In this implementation, a GLC OA-LBL layer of right-handed chirality and a GLC OA-LBL layer of left-handed chirality are deposited successively on the exposed side of the TOUPLED substrate. Following deposition, both layers are subjected to an identical photomodulation process to tune the GLC OA-LBL layers to encompass the wavelength band emitted by the organic light-emitting layer. The photomodulation process may be accomplished by using either an external radiation source or light emitted by the TOUPLED light emitting layer itself. Chiral light with a right handed helicity may be reflected by the right-handed OA-LBL and chiral light with left handed helicity may be reflected by the left-handed OA-LBL. Electrons in the spin-up state produce a chiral light wave with right handed helicity, that in turn may be reflected by the right-handed OA-LBL. The result is a transparent device that emits chiral light only from that side of the device that does not have the OA-LBL layer or layers.

In some implementations, the OA-LBL may include a holographic optical recording material layer which is irradiated to form a multiplexed holographic notch filter. The holographic optical recording material layer may be irradiated with multiple collimated object beams which are circularly polarized and have a common chirality. The beams are projected at a series of angles, and successively interfere with a common collimated reference beam to generate several multiplexed reflection holograms in the recording material layer. Both the wavelength and series of angles of the beams are chosen to create a multiplexed hologram that efficiently reflects radiation over the desired field of view at wavelengths within the emission band of the TOUPLED light emitting layer.

Ambient light is randomly polarized and includes a combination of waveforms polarized in all orientations. The majority of ambient light is of a wavelength that is outside of the OA-LBL stop band (which also may be referred to as the reflection band) and is therefore transmitted by the OA-LBL layer. The relatively small portion of ambient light that falls into the OA-LBL stop band and that also matches the chirality of the OA-LBL is reflected. Chiral light produced within the TOUPLED from a population of electrons in the spin up state, for example, may be emitted from the top of the device and absorbed or reflected by the OA-LBL on the bottom of the device. In contrast, the device is equally transparent to ambient light passing through the device in either direction.

Figure 7:
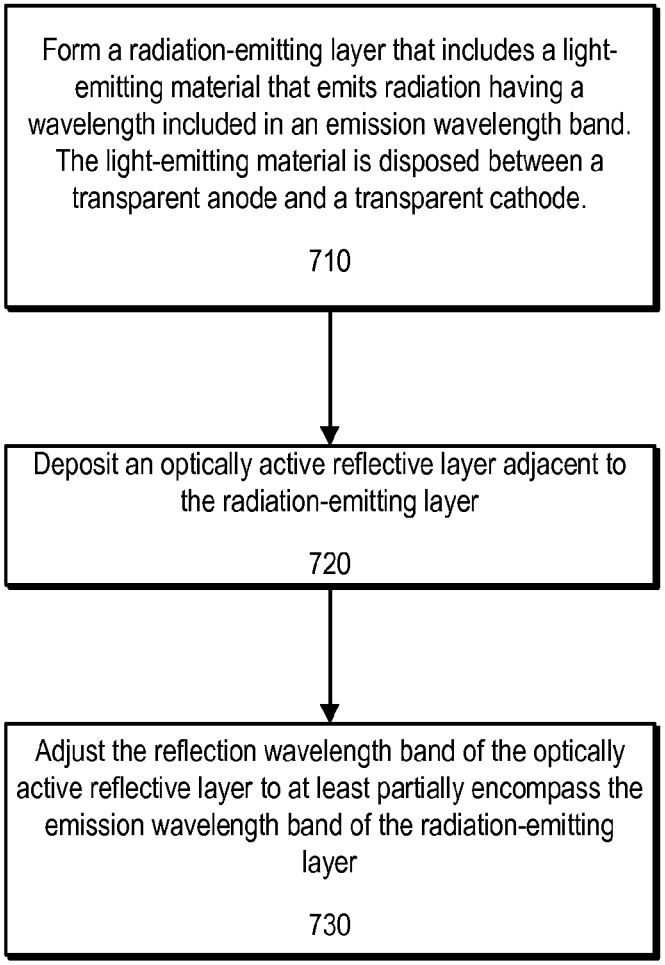
FIG. 7 shows an example process for fabricating a directionally biased light emitting device.

Referring to FIG. 7, an example process 700 for fabricating a directionally biased light emitting device is shown. The polarized light emitting device may be a TOUPLED as discussed above. A radiation-emitting layer is formed (710). The radiation-emitting layer includes a radiation-emitting material is disposed between a transparent anode and a transparent cathode. The radiation-emitting material has a spectral emission band such that all radiation, or almost all radiation, emitted from the radiation-emitting material has a wavelength that falls within the emission band. The emission band of the radiation-emitting material depends on properties, such as index of refraction, of the material from which the radiation-emitting layer is made. The radiation-emitting material may be a light-emitting layer made from an organic material such as, for example, Alq3+C6. The radiation-emitting material may be a light-emitting layer such as the light-emitting layers 7, 201, 330, 410, 22, and 32 discussed above.

Typical radiation emission layers emit light in a uniform Lambertian distribution—light emitting evenly in all directions about the source. Ideally, the OA-LBLs correspondingly block light in a Lambertian manner. However, many less expensive OA-LBLs are only capable of reflecting light that is incident in an envelope of limited angle, for example, angles of less than 40 degrees. To enhance performance of less expensive OA-LBLs, an optional prefabricated light-collimating layer may be deposited between the radiation emitting layer and the OA-LBL. Materials suitable for use as light collimating layers include, for example, photonic crystal composites designed for narrow or wide-band collimation, and micro-louver films such as the Vikuiti Light Control Films available through 3M Corporation.

An optically active reflective layer is deposited adjacent to the radiation-emitting layer (720). Thus, the optically active reflective layer may be on the anode side or the cathode side of the radiation-emitting layer. The optically active reflective layer may include glass-forming chiral nematic liquid crystals, and the optically active reflective layer has a spectral reflection band that may be referred to as the reflection wavelength band. The optically active reflective layer reflects radiation that has a wavelength within the reflection band. The optically active reflection layer transmits little, if any, radiation that has a wavelength in the reflection band and possesses the same chirality as the optically active reflection layer (because the optically active reflection layer reflects such radiation). The optically active reflective layer may be deposited on a transparent substrate such as the transparent substrates 4, 204, 340, 420, 24, and 34 discussed above. The transparent substrate may be located between the optically active layer and the radiation-emitting layer, but that is not necessarily the case. The optically active reflective layer may include a first glassy liquid crystal (GLC) film made of a right-handed material and a second GLC film made of a left-handed material that is adjacent to the first GLC film.

The reflection wavelength band of the optically active reflective layer is adjusted to at least partially encompass the emission wavelength band of the radiation-emitting layer (730). Thus, after the reflection wavelength band of the optically active layer is adjusted, the optically active layer reflects radiation that is emitted from the radiation-emitting layer. However, because the layers of the device are transparent to ambient light, a user of the device is able to see through the device. Thus, as discussed below, the device may be used for in-line-of-sight illumination applications. As discussed above, adjusting the optically active reflection layer may include photomodulating the optically active reflection layer, adjusting the molecular composition of the optically active layer, or photomodulating the optically active layer after adjusting the molecular composition of the optically active layer. Some implementations where a broad-band circular polarization film is used may not require any optical adjustment steps during fabrication of the device, because the film already possesses established optical properties.

A second optically active layer may be deposited on the optically active layer deposited in (720). The second optically active layer has a chirality that is opposite that of the optically active layer deposited earlier. Thus, if the earlier-deposited optically active layer has a left-handed chirality, the second optically active layer has a right-handed chirality. The reflection wavelength band of the second optically active layer may be adjusted separately from the first optically active reflection band and adjusted on a separate substrate. Once the reflection band of the second optically active layer is adjusted, the second optically active layer may be bonded to one side of the TOUPLED device.

The directionally biased transparent light-emitting devices discussed above such as devices 200, 300, 400, 500A, 500B, and 600 may be used in an electronic display, in-line-of-sight illumination applications, and in dual-sided transparent display applications. For example, the devices may be used in a non-transparent flat panel display and standard applications of flat panel displays, and the devices may be used in transparent flat panel electronic displays including active matrix-based displays having a thin film transistor (TFT) backplane, passive matrix-based displays, monochrome displays, or full-color displays. To use the device in an electronic display, the GLC layer may be pixilated such that portions of the GLC layer are individually addressable.

To use the light-emitting device in an monochrome display, a single optically active layer (e.g., a GLC or sculptured thin film) that is shared by all, or multiple, pixels that make up the display) may be used. For full-color displays in which sets of red, green, and blue pixels are arranged in a spatial pattern and used to make a multi-color display, the reflection band of various portions of the GLC layer may be selectively tuned by exposing the various portions of the GLC layer to photomodulation. In this manner, the GLC may be considered to be pixilated.

Figure 8A:
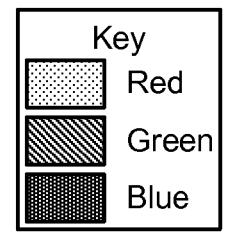
FIGS. 8A-8C illustrate an example process of pixilating a phototunable liquid crystal.
Figure 8A:
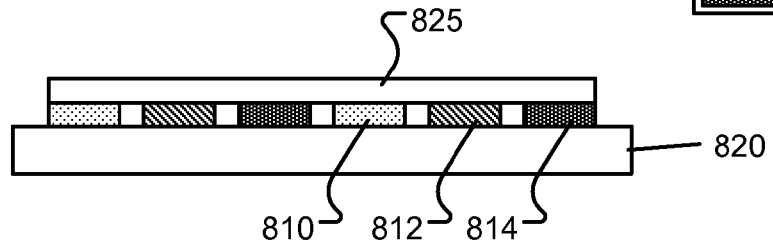
Figure 8B:
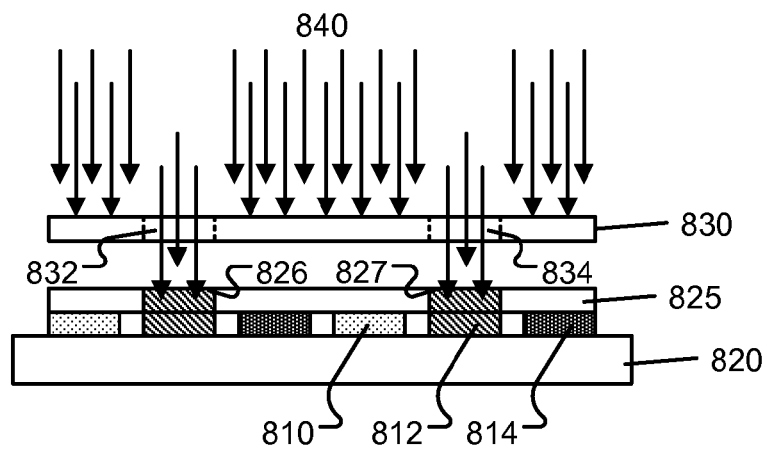
Figure 8C:
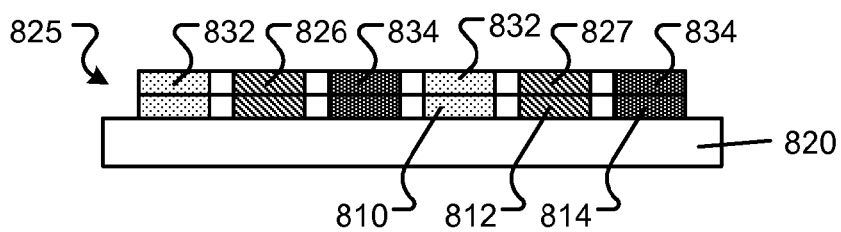

FIGS. 8A-8C illustrate a process for pixilating a GLC, or other phototunable optically active material.

Referring to FIG. 8A, a red-light emitting layer 810, a green-light emitting layer 812, and a blue-light emitting layer 814 are deposited on a glass substrate 820. Each of the red-light emitting layer 810, the green-light emitting layer 812, and the blue-light emitting layer 814 may be OLEDs that emit, respectively, red light, green light, and blue light. A phototunable optically active reflective layer 825 is disposed on the emitting layers 810, 812, and 814.

Referring to FIG. 8B, a shadow mask 830 having openings 832 and 834 is positioned above the phototunable optically active reflective layer 825. The openings 832 and 834 are sized to correspond to a size of a pixel to be formed on the optically active reflection layer 825. UV radiation 840 is directed towards the shadow mask 825 and passes through the openings 832 and 834 to irradiate portions 826 and 827, respectively, of the optically active reflecting layer 825. The portions 826 and 827 are exposed to the UV radiation 840 for a sufficient amount of time to tune the reflection band of the portions 826 and 827 such that the portions 826 and 827 reflect red light having a helicity that is the same as that of the layer 825. Subsequently, the shadow mask 830 may be repositioned (not shown) relative to the optically active layer 825 such that other portions of the optically active reflective layer 825 are exposed to the UV radiation 840. As a result, the reflection band of each of these portions is tuned to reflect red, green, or blue light depending on the time duration of the exposure the UV radiation 840.

Referring to FIG. 8C, the localized irradiation of the optically active reflecting layer 825 has been repeated to produce, in addition to portions 826 and 827, portions 832, which reflect green light, and portions 834, which reflect blue light. Thus, the optically active reflecting layer 825 has been pixilated into portions (which may be pixels) that reflect red light, portions that reflect green light, and portions that reflect blue light. As a result, light emitted from the light-emitting layers 810, 812, and 814 is reflected from, respectively, the portions 832, 827, and 834 of the optically active reflective layer 825 and passes through the transparent substrate 820.

Thus, FIGS. 8A-8C illustrate a process for pixilating an optically active reflective layer, such as a GLC. However, for applications in which maximization of transmission of ambient light is not a priority, instead of pixilating an optically active reflective layer into individual pixels or portions having individually tailored reflection bands, the optically active layer may be deposited in a continuous strip, strips, or sheet that spans the entire height and/or width, or a portion of the height or width, of the emitting device. Configurations that use a single, non-pixilated optically active reflective layer may be simpler and/or less expensive to manufacture than an implementation that includes a pixilated GLC.

FIGS. 9A-11A each illustrate a perspective view of an example configuration of a directionally biased light-emitting device that includes multiple single optically active reflective layers. FIGS. 9B-11B, respectively, show a side-view of a vertical cross-section of the configurations shown in FIGS. 9A-11A.

Figure 9A:
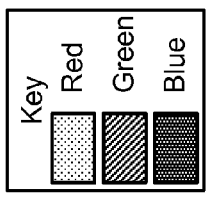
Figure 9A:
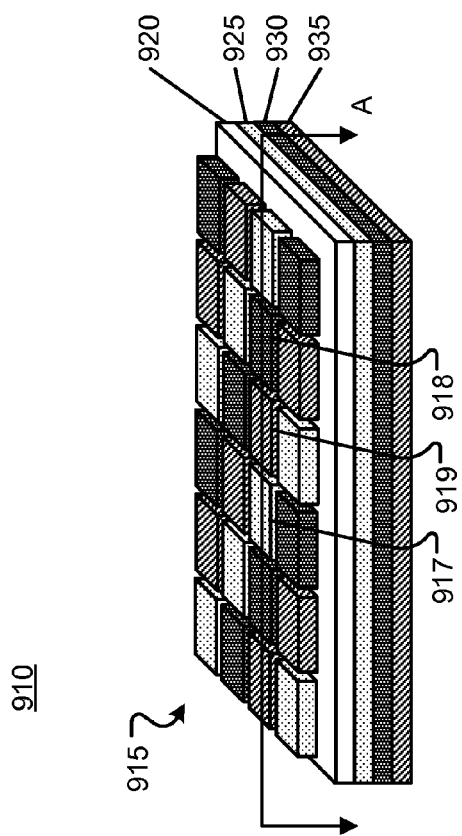

Referring to FIG. 9A, a directionally biased light-emitting device 910 includes pixels 915, a transparent substrate 920, an optically active layer 925 with a reflection band tuned to reflect red light, an optically active layer 930 with a reflection band tuned to reflect green light, and an optically active layer 935 with a reflection band tuned to reflect blue light. The pixels 915 may be OLEDs that preferentially emit light from the bottom (the side in contact with the transparent substrate 920), and each of the optically active reflective layers 925, 930, 935 are shared among all pixels 915. The optically active reflection layers 925, 930, and 935 may be arranged in a different order, such as shown in FIGS. 10A and 11A.

In operation, the pixels 915 are transparent to light and are, thus, able to emit light from both sides (e.g., from the top and bottom of the pixel). However, the light emitted by the pixels 915 is preferentially emitted towards the bottom of the pixel (e.g., toward the transparent substrate 920). Light that is emitted from the bottom of the pixel passes through the transparent substrate 920 and is reflected from one of the layers 925, 930, 935 that has a reflection band that includes the wavelength and chirality of the light emitted from the pixel. For example, pixel 918 emits blue light that passes from the bottom of the pixel 918 through the substrate 925 and through the red layer 925. The light is then reflected from the blue layer 930 and exits through the top of the pixel 918 as blue light. The blue light from the pixel 918 does not reach the green layer 935. The pixel 919 emits green light that from the bottom of the pixel 919. The emitted light passes through the red optically active layer 925 and the blue optically active layer 930 before the light is reflected from the green optically active layer 935. The reflected light is transmitted by the blue optically active layer 930, the red optically active layer 925, the substrate 920, and the pixel 919 to exit the display 910A as green light. The pixel 917 emits red light into the transparent substrate 920, and the light is reflected from the red optically active layer 925 and exits the device 910 as red light.

Figure 9B:
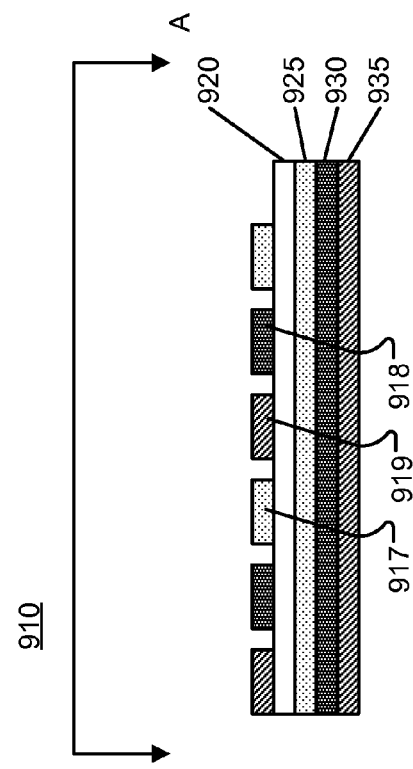

Referring to FIG. 9B, a side view of a vertical cross-section of the device 910 taken along the line "A" is shown. As shown in FIG. 9B, each of the optically active layers 925, 930, and 935 are under the pixels 917, 918, 919. Although not shown, the optically active layers 925, 930, and 935 are also under the remaining pixels 915.

Figure 10A:
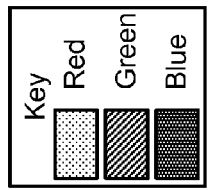
Figure 10A:
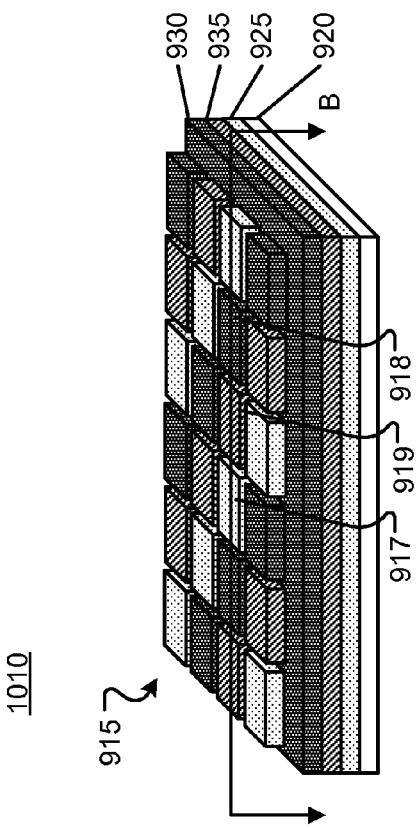
Figure 11A:
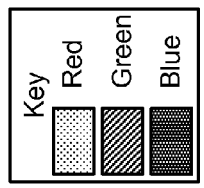
Figure 11A:
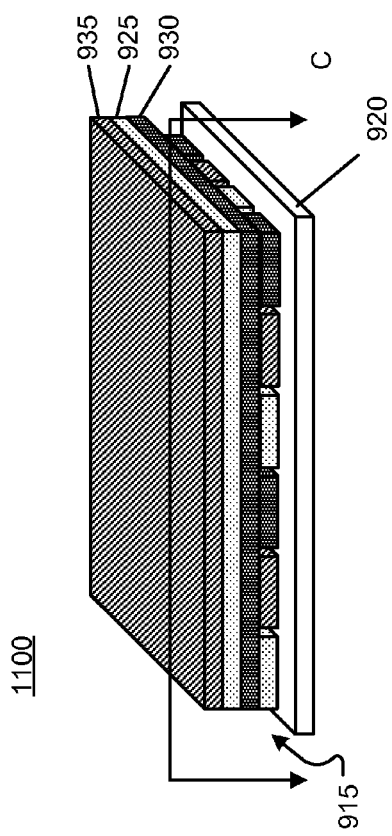

Referring to FIG. 10A shows a perspective view of a directionally biased light-emitting device 1010. The display device 1010 is similar to the device 910 except that the pixels 915 are deposited on the optically active layers 925, 930, and 935 rather than on the transparent substrate 920. In the implementation shown in FIG. 10A, the optically active layers 925, 930, and 935 are deposited on the transparent substrate 920. Thus, in this implementation, light emitted from the bottom of the pixel 918 is reflected off of the blue optically active layer 930 without passing through the transparent substrate 920. This implementation may result in improved performance (e.g., increased brightness from the device 1010) because of, for example, reduction in losses caused by light passing through the substrate 920 as the light passes from the pixels 915 to the appropriate optically active layer.

Figure 10B:
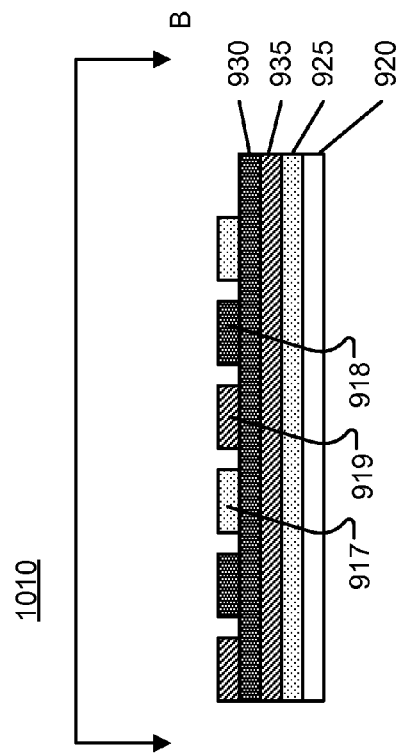

FIG. 10B shows a side-view of a vertical cross-section of the device 1010 taken along the line "B".

Figure 11B:
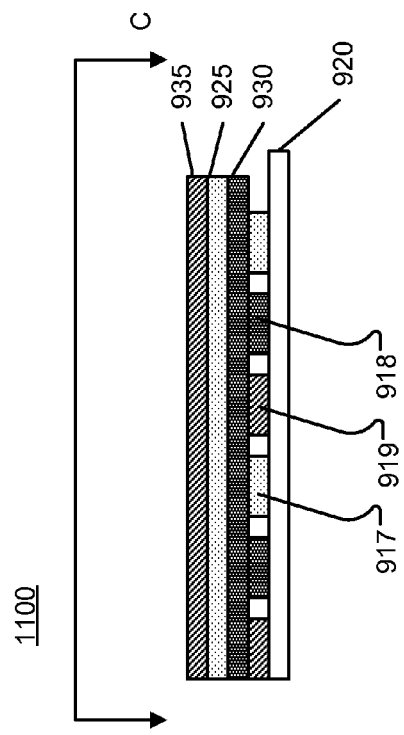

FIG. 11A shows a perspective view of a directionally biased light-emitting device 1100. In the device 1100, the pixels 915 are deposited on the substrate 920, and the optically active reflective layers 925, 930, 935 are bonded to the pixels 915. In this implementation, the optically active reflective layers are formed on a separate substrate, tuned such that their respective reflection bands reflect red, green, or blue light, and then bonded to the pixels 915. In this implementation, light is preferentially emitted from the top of the pixels 915, reflects off of the appropriate optically active layer, passes through the pixels 915 again, and exits the device 1100 through the transparent substrate 920. In such a design, the substrate 520 may provide protection for the pixels 915 as well as a platform for deposition. FIG. 11B shows a side view of a vertical cross-section of the device 1100 taken along the line "C".

In the examples shown in FIGS. 9A-11A, the pixels 915 are arranged in a delta configuration in which pixels that emit a particular color are arranged along diagonal lines. However, the pixels 915 may be arranged in other configurations that are suitable for RGB displays. For example, the pixels 915 may be arranged in a striped pattern that includes alternating contiguous segments of red-light emitters, green-light emitters, and blue-light emitters. In another example, the pixels 915 may be arranged in a mosaic pattern, or a Pentile® pattern. The Pentile® pattern is available from Samsung Electronics Co., LTD. of the Republic of Korea.

Figure 12:
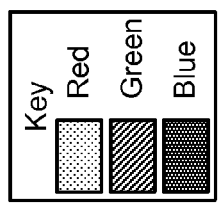
FIG. 12 shows a stacked transparent light-emitting device.
Figure 12:
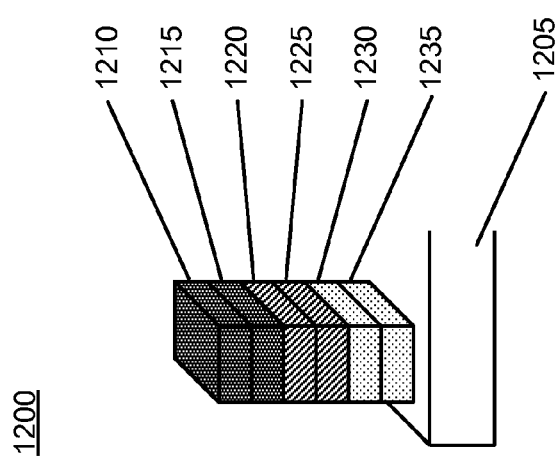

Referring to FIG. 12, a stacked transparent light-emitting device is shown. A single pixel, or emitting layer, 1200 is deposited on a transparent substrate 1205. The pixel 1200 includes a blue-light emitting layer 1210, an optically active reflective layer 1215 that reflects blue light, a green-light emitting layer 1220, an optically active reflective layer 1225 that reflects green light, and a red-light emitting layer 1230, an optically active reflective layer 1235 that reflects red light. In the implementation shown in FIG. 12, each of the light-emitting layers 1210, 1220, and 1230 are associated with a transparent anode (not shown) and a transparent cathode (not shown) that controls the emission of light from each of the light-emitting layers.

The implementation shown in FIG. 12 is different from those shown in FIGS. 9A-11A because each of the light-emitting layers in device 1200 has a corresponding optically active reflection layer that is adjacent to the emitting layer. Thus, in device 1200, light emitted from one of the light-emitting layers is reflected from the adjacent layer instead of traveling through multiple layers as may be the case in the implementations shown in FIGS. 9A-11A. As a result, improved performance (e.g., greater intensity of light emitted from the top of the device 1200) may be realized due to the minimization of waveguiding.

Figure 13:
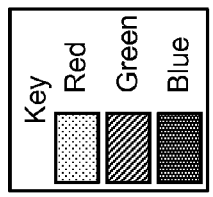
FIG. 13 shows another stacked transparent light-emitting device.
Figure 13:
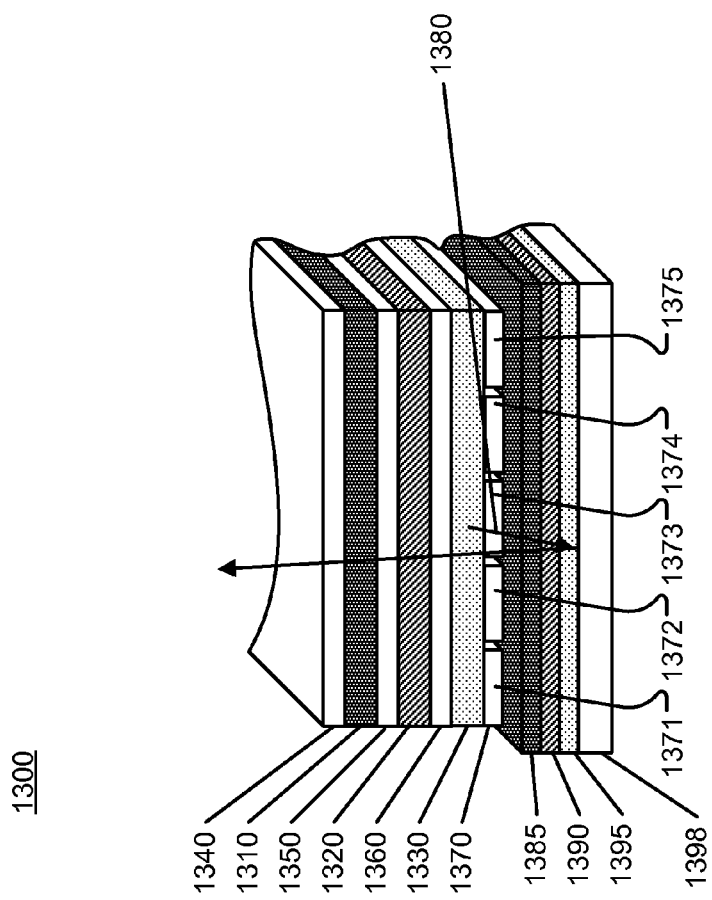

Referring to FIG. 13, a TOUPLED as a stacked transparent light-emitting device is shown. FIG. 13 shows a device 1300 that is pixilated by selective activation of portions of a stack of light-emitting layers. The device 1330 includes various light-emitting layers, each of which have a corresponding transparent cathode, and each of which share a common transparent anode. The common anode is divided into separate segments, and activation of a particular segment of the anode and one of the cathodes causes light from the corresponding portion of the light-emitting layers to be emitted.

In greater detail, the device 1300 includes a blue-light emitting layer 1310, a green-light emitting layer 1320, and a red-light emitting layer 1330. A transparent cathode 1340 contacts the blue-light emitting layer 1310, a transparent cathode 1350 is positioned between the blue-light emitting layer 1310 and the green-light emitting layer 1320, and a transparent cathode 1360 is positioned between the green-light emitting layer 1320 and the red-light emitting layer 1330. A transparent anode 1370 is segmented into portions 1371-1375 such that light is emitted from a particular light-emitting layer, and from a particular portion of the light-emitting layer, depending on which portion of the anode 1370 is activated. For example, activating the anode portion 1372 and the cathode 1360 causes red light 1380 to be emitted from the red-light emitting layer 1330.

The device 1300 also includes optically active reflective layers 1385, 1390, and 1395 deposited on a transparent substrate 1380. The optically active reflective layers 1385, 1390, and 1395 are tuned to reflect, respectively, blue light, green light, and red light. Continuing with the example of the red light 1380, the red light 1380 reflects off of the optically active reflection layer 1395, propagates up through the other optically active layers 1385 and 1390, neither of which reflect red light, through the transparent anode 1370, the light emitting layers 1310, 1320, and 1330, and the cathodes 1340, 1350, and 1360 to exit the device 1300 through the transparent cathode 1370.

Thus, FIGS. 8A-8C, 9A-11A, 9B-11B, 12, and 13 all show a transparent device that includes an optically active reflective layer that causes the device to preferentially emit light from one side of the device. The spectral content of the emitted light is controllable through the tuning of the reflection band of the optically active layer or layers. A user may see through such a device, thus, in addition to displays, in implementations where pixilated optically active reflectors are used or where optically active layers with a single chirality (i.e. left- or right-handed) are used, these devices may be placed in the line-of-sight of a user and used to illuminate a region in view of the user.

In addition to being used in the standard displays mentioned above, the transparent light emitting device may be used in transparent head-up displays (HUDs) for the display of information or for use in virtual or augmented reality applications. A head-up display may be a transparent display that presents visual data in the line-of-sight of a user such that the user may view the data without having to look away from their usual viewpoint. The TOUPLED discussed above may be used in a variety of head-up displays. For example, the TOUPLED may be used in vehicular HUD and general illumination applications such as applications that display information on a vehicle's windshield (e.g., aircraft, automobile, motorcycle), automobile signal lights, air traffic control, and visual landing aid lighting.

The TOUPLED also may be used in helmet-mounted HUD applications such as aircraft pilot visor HUDs, combat solider embedded helmet HUDs, embedded protective helmet visor HUDs used by, for example, search and rescue workers, and visors used by athletes, such as football helmet visors. Additionally, the TOUPLED may be used in architectural HUD applications, such as digital signage (e.g. billboards, "spectacular" or architectural displays on buildings), retail displays used for narrowcasting, and window-mounted or embedded displays. The TOUPLED also may be used in personal electronic device applications, such as near-eye head-up displays, in which the TOUPLED display device is integrated on to a head mounted apparatus such as a pair of eyeglasses, sunglasses or visor. Such devices may be utilized for virtual reality or augmented reality applications. In some implementations, the TOUPLED may be part of a very near-eye display, in which the TOUPLED display device is integrated on a curved surface intended for direct contact with the eye such as a contact lens. The TOUPLED device also may be used with personal desktop and laptop computer displays, portable electronics devices such as PDAs, cellular phones, digital music players, digital game players, GPS devices, and electronic readers.

The TOUPLED also may be used in photo-sensitive devices in which the TOUPLED transparent display pixel matrix is interlaced with photo-detectors on an integrated circuit, such as a Complimentary-Metal Oxide Semiconductor (CMOS) circuit. The TOUPLED also may be used in stereoscopic displays for three-dimensional viewing of electronic images. In a stereoscopic display, two images are created from a single TOUPLED display device. Each of the images is generated with spin-polarized TOUPLED pixels that emit pure, or nearly pure, helically polarized light. Such a system may require the viewer to wear eye-wear possessing polarized filtered lenses to permit each eye to perceive the two separate images generated by the display.

TOUPLEDs also may be used in dual-sided transparent display applications. In such displays, two TOUPLED devices are joined so that the respective optically active blocking layers of each device are adjacent to each other. Light is emitted from each device in opposing directions to create a display that is active on two sides that are opposite to each other. The TOUPLED also may be used for illuminating an area and in active electro-optical camouflage systems.

TOUPLED devices may be used for in-line-of-sight illumination for task lighting. For example, TOUPLEDs may be used in a head-mounted apparatus to provide head-mounted illumination. Because the TOUPLED is transparent and emits light from one side, the head-mounted apparatus may be mounted in the line of sight of the user such that the region in the line-of-sight of the user is illuminated while the user also views the region through the TOUPLED. TOUPLEDs also may be used in systems that use and/or provide visual feedback. For example, TOUPLED devices may be integrated on an industrial or medical boroscope lens, a microscope lens, and other inspection devices. TOUPLED devices also may be used with or integrated with cameras.

It is understood that other modifications are within the scope of the claims. For example, although red, blue, and green light-emitters are discussed above, other colors may be used.

What is claimed is:

1. A method of fabricating a polarized light-emitting device, the method comprising:
  forming a radiation-emitting layer, the radiation-emitting layer comprising a radiation-emitting material configured to emit radiation having a wavelength included in an emission wavelength band and being disposed between a transparent anode and a transparent cathode;
  depositing an optically active reflective layer on the polarized light-emitting device, the optically active reflective layer being configured to reflect radiation having a wavelength included in a reflection wavelength band of the optically active reflective layer; and
  adjusting the reflection wavelength band of the optically active reflective layer to at least partially encompass the emission wavelength band of the radiation-emitting layer.

2. The method of claim 1, wherein the radiation-emitting material comprises an organic light-emitting layer.

3. The method of claim 1, wherein the optically active reflective layer comprises a layer of glass-forming chiral nematic liquid crystals (GLC).

4. The method of claim 3, wherein adjusting the reflection wavelength band of the optically active reflective layer comprises:
  heating the layer of glass-forming chiral nematic liquid crystals above a glass transition temperature (Tg) and near a critical point (Tc) of the glass-forming chiral nematic liquid crystals;
  irradiating the optically active reflective layer with electromagnetic radiation for a time duration sufficient to alter the reflection wavelength band of the optically active reflective layer to at least partially encompass the emission wavelength band of the radiation-emitting material; and cooling the optically active reflective layer to a temperature below the glass transition temperature (Tg).

5. The method of claim 4, wherein irradiating the optically active reflective layer comprises irradiating the optically active reflective layer with ultraviolet (UV) radiation.

6. The method of claim 3, wherein adjusting the reflection wavelength band of the optically active reflective layer comprises adjusting a molecular composition of the layer of glass-forming chiral nematic liquid crystals.

7. The method of claim 3, wherein:
the optically active reflective layer comprises a first GLC film made of a right-handed glassy cholesteric material, and a second GLC film made of a left-handed glassy cholesteric material, the second GLC film being adjacent to the first GLC film, and
adjusting the reflection wavelength band of the optically active reflective layer comprises adjusting a molecular ratio of the right-handed glassy cholesteric material to the left-handed glassy cholesteric material.

8. The method of claim 7, wherein, to adjust the reflection band of the optically active reflective layer, the molecular composition of both the first GLC film and the second GLC film are adjusted.

9. The method of claim 1, wherein adjusting the reflection wavelength band of the optically active reflective layer results in changing a width of the reflection wavelength band.

10. The method of claim 1, wherein the radiation-emitting material comprises a quantum dot layer.

11. The method of claim 1, further comprising:
depositing a second optically active reflective layer on the optically active reflective layer, the second optically active reflective layer and the optically active reflective layer having opposite chirality; and
adjusting the reflection wavelength band of the second optically active reflective layer to at least partially encompass the emission wavelength band of the light-emitting layer.

12. The method of claim 11, wherein the optically active reflective layers are deposited consecutively, the reflection wavelength band of the second optically active reflective layer is adjusted on a separate substrate, and the optically active reflective layer is bonded to one side of the polarized light emitting device after the reflection wavelength band of the second optically active reflective layer is adjusted.

13. The method of claim 1, wherein the optically active layer is deposited on a transparent substrate.

14. The method of claim 13, wherein the transparent substrate is located between the optically active reflective layer and the light-emitting layer.

15. The method of claim 1,
wherein the optically active reflective layer comprises a holographic optical recording material layer; and
wherein adjusting the reflection wavelength band of the optically active reflective layer comprises:
irradiating a holographic optical recording material layer with two or more collimated object beams that successively interfere with a common collimated reference beam to generate several multiplexed reflection holograms on the holographic optical recording material layer,
wherein the object beams are circularly polarized, have the same chirality, have a specified wavelength to at least partially encompass the emission wavelength band of the radiation-emitting layer, and are incident to the holographic optical recording material layer at a series of angles chosen to maximize the reflection efficiency over a desired field of view at the specified wavelength.

16. The method of claim 1, wherein adjusting the reflection wavelength band of the optically active reflective layer results in changing the incident angles at which the reflection wavelength band is achieved.

17. The method of claim 1,
wherein the optically active reflective layer has a chirality, such that the optically active reflective layer is configured to reflect radiation having a chirality matching the chirality of the optically active reflective layer; and
and wherein the method further comprises adhering a prefabricated broad-band circular polarization filter between the light-emitting layer and the optically active reflective layer, wherein the circular polarization filter has a chirality that is opposite the chirality of the optically active reflective filter.

18. The method of claim 1, further comprising:
adhering a prefabricated radiation-collimating layer between the radiation-emitting layer and the optically active reflective layer, wherein the radiation-collimating layer has an optical property of limiting the direction of radiation that is emitted by the radiation-emitting layer to an angle less than 40 degrees from normal relative to a surface of the polarized light emitting device.

19. The method of claim 18 wherein the prefabricated radiation-collimating layer is one of a photonic crystal composite film or a micro-louver film.

20. A method of fabricating a polarized light-emitting device, the method comprising:
forming a radiation-emitting layer, the radiation-emitting layer comprising a radiation-emitting material configured to emit radiation having a wavelength included in an emission wavelength band and being disposed between a transparent anode and a transparent cathode;
depositing an optically active reflective layer on the polarized light-emitting device, the optically active reflective layer being configured to reflect radiation having (i) a wavelength included in a reflection wavelength band of the optically active reflective layer and (ii) a chirality matching a chirality of the optically active reflective layer; and
adjusting the reflection wavelength band of the optically active reflective layer to at least partially encompass the emission wavelength band of the radiation-emitting layer.

* * * * *